(12) United States Patent
Xiao

(10) Patent No.: US 8,653,586 B2
(45) Date of Patent: Feb. 18, 2014

(54) SUPERJUNCTION DEVICE AND METHOD FOR MANUFACTURING THE SAME

(75) Inventor: Shengan Xiao, Shanghai (CN)

(73) Assignee: Shanghai Hua Hong Nec Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/603,658

(22) Filed: Sep. 5, 2012

(65) Prior Publication Data

US 2012/0326226 A1  Dec. 27, 2012

(30) Foreign Application Priority Data

Sep. 8, 2011 (CN) .......................... 2011 1 0265394

(51) Int. Cl.
*H01L 29/78* (2006.01)
*H01L 21/20* (2006.01)

(52) U.S. Cl.
USPC ............... 257/329; 257/E29.262; 257/E21.09

(58) Field of Classification Search
USPC .............. 438/478; 257/329, E29.262, E21.09
See application file for complete search history.

(56) References Cited

U.S. PATENT DOCUMENTS 5,216,275 A   6/1993   Chen
6,630,698 B1  10/2003  Deboy et al.

*Primary Examiner* — Matthew W Such
*Assistant Examiner* — Monica D Harrison
(74) *Attorney, Agent, or Firm* — MKG, LLC

(57) ABSTRACT

A superjunction device is disclosed, wherein P-type regions in an active region are not in contact with the N+ substrate, and the distance between the surface of the N+ substrate and the bottom of the P-type regions in the active region is greater than the thickness of a transition region in the N-type epitaxial layer. Methods for manufacturing the superjunction device are also disclosed. The present invention is capable of improving the uniformity of reverse breakdown voltage and overshoot current handling capability in a superjunction device.

21 Claims, 5 Drawing Sheets

SUPERJUNCTION DEVICE AND METHOD FOR MANUFACTURING THE SAME

CROSS-REFERENCE TO RELATED APPLICATIONS

This application claims the priority of Chinese Patent Application No. 201110265394.X, filed on Sep. 8, 2011, the entire contents of which are incorporated herein by reference.

TECHNICAL FIELD

The present invention relates to the field of semiconductor integrated circuit manufacturing, and more particularly, to a superjunction device and its manufacturing method.

BACKGROUND

By adopting a new voltage-withstanding structure consisting of a series of alternately arranged P-type and N-type semiconductor thin layers, a superjunction device has an advantage that both the P-type and N-type semiconductor thin layers can be fully depleted at a relative low voltage in an off-state, enabling the compensation of electric charges, and thereby exhibiting a high breakdown voltage even if the P-type and N-type semiconductor thin layers have a relatively high impurity concentration, thus achieving a low on resistance and a high breakdown voltage at the same time. U.S. Pat. No. 5,216,275 discloses the above-mentioned alternately arranged P-type and N-type semiconductor thin layers, wherein the thin layers are in contact with an N+ substrate. U.S. Pat. No. 6,630,698 also discloses the above-mentioned alternately P-type and N-type semiconductor thin layers, wherein the semiconductor thin layers in a central region may be separated from the N+ substrate by a distance greater than zero.

In the prior art, the P-type and N-type semiconductor thin layers can be formed by repeating a process of epitaxial growth followed by photolithography and implantation until a total thickness of the P-type and N-type semiconductor thin layers meets a desired value. For a MOSFET with a breakdown voltage higher than 600V, the process generally needs to be repeated for more than 5 times, resulting in a high manufacturing cost and a long production cycle. Another way to form P-type and N-type semiconductor thin layers is to grow an epitaxial layer of a certain type to a desired thickness in one time, and then etch trenches and fill the trenches with a silicon of the opposite type, so as to reduce the manufacturing cost and shorten the production cycle. However, if there is a distance between the semiconductor thin layers and the substrate, the depths of the trenches in different devices are likely to vary due to the variations in process conditions during trench-etching, which may lead to a great difference in reverse breakdown voltage among different devices. Especially, in the case that the distance between the N+ substrate and the bottom of the trenches is smaller than a certain value, not only the breakdown voltage of a device is likely to vary according to the process conditions, but also the capability of sustaining current surge, such as the single pulse avalanche energy (EAS), of a device is likely to vary according to the process conditions, which will greatly affect the uniformity of the devices.

SUMMARY OF THE INVENTION

An objective of the present invention is to provide a superjunction device to improve the uniformity of reverse breakdown voltage and overshoot current handling capability in superjuction devices. To this end, the present invention is also to provide a manufacturing method of such superjunction device.

To achieve the aforementioned objective, the present invention provides a superjunction device, which includes an N+ substrate and an N-type epitaxial layer formed on the N+ substrate; a transition region exists in the N-type epitaxial layer and is adjacent to the surface of the N+ substrate; a central area of the superjunction device is defined as an active region, and a peripheral area of the superjunction device surrounding the active region is defined as a terminal protection region, wherein the superjunction device further includes: a plurality of parallelly arranged first trenches formed in the N-type epitaxial layer in the active region, and a plurality of second trenches surrounding the active region formed in the N-type epitaxial layer in the terminal protection region; a P-type impurity is filled into the first trenches to form a plurality of P-type pillars; the P-type pillars and the N-type epitaxial layer form alternately arranged P-type and N-type regions; a P-type impurity is filled into the second trenches to form a plurality of P-type annular columns; the P-type annular columns and the N-type epitaxial layer form alternately arranged P-type and N-type regions; wherein none of the P-type pillars in the active region is in contact with the N+ substrate, and the distance between the surface of the N+ substrate and the bottom of any one of the P-type pillars in the active region is greater than the thickness of the transition region.

In a preferred embodiment, all of the P-type annular columns in the terminal protection region are in contact with the N+ substrate.

In a preferred embodiment, none of the P-type annular columns in the terminal protection region is in contact with the N+ substrate, and the distance between the surface of the N+ substrate and the bottom of any one of the P-type annular columns in the terminal protection region is greater than the thickness of the transition region.

In a preferred embodiment, at least one P-type annular column at the outermost of the terminal protection region is not in contact with the N+ substrate; the distance between the surface of the N+ substrate and the bottom of the at least one P-type annular column at the outermost is greater than the thickness of the transition region; the rest of the P-type annular columns in the terminal protection region are in contact with the N+ substrate.

In a preferred embodiment, each P-type annular column in the terminal protection region forms a contact with the N+ substrate through a P-type implantation ring formed in the N-type epitaxial layer between the N+ substrate and the bottom of the P-type annular column.

In a preferred embodiment, at least one P-type annular column at the outermost of the terminal protection region is not in contact with the N+ substrate; the distance between the surface of the N+ substrate and the bottom of the at least one P-type annular column at the outermost is greater than the thickness of the transition region; each of the rest of the P-type annular columns in the terminal protection region forms a contact with the N+ substrate through a P-type implantation ring formed in the N-type epitaxial layer between the N+ substrate and the bottom of the P-type annular column In a preferred embodiment, the superjunction device may further include P-wells and a P-type ring; the P-wells are formed beneath the surface of the N-type epitaxial layer in the active region; each P-well covers the top of a P-type pillar and surrounds the P-type pillar; the P-type ring is formed beneath the surface of the N-type epitaxial layer in the terminal protection region, and is adjacent to the active region and covers at least one of the P-type annular columns.

In a preferred embodiment, the superjunction device may further include: source regions, formed in each of the P-wells; gate structures, formed above the N-type epitaxial layer, wherein each gate structure corresponds to a P-well and includes from bottom up a gate oxide and a polysilicon gate; a drain electrode, formed at the backside of the N+ substrate; a channel stopper, which is formed beneath the surface of the N-type epitaxial layer and is close to the outside border of the terminal protection region; a terminal dielectric film, formed on the N-type epitaxial layer in the terminal protection region, having a step structure at a side near the active region, covering the P-type ring and all of the P-type annular columns in the terminal protection region; a polysilicon field plate, formed on the terminal dielectric film and covering a part of the terminal dielectric film which contains the entire step structure; an inter layer film, formed on the N-type epitaxial layer in the terminal protection region, the terminal dielectric film, the polysilicon field plate, and top face and side faces of each gate structure.

To achieve the aforementioned objective, the present invention further provides a method for manufacturing superjunction device. The method includes the following steps:

step 1: forming an N-type epitaxial layer on an N+ substrate, and forming P-wells in an active region and a P-type ring in a terminal protection region beneath the surface of the N-type epitaxial layer;

step 2: respectively forming first trenches and second trenches in the N-type epitaxial layer, wherein none of the first trenches is in contact with the N+ substrate, and the distance between the surface of the N+ substrate and the bottom of any one of the first trenches is greater than the thickness of the transition region;

step 3: filling the first trenches with a P-type impurity to form P-type pillars and filling the second trenches with a P-type impurity to form P-type annular columns, so as to form alternately arranged P-type and N-type regions respectively in the active region and in the terminal protection region.

In a preferred embodiment, in step 2, all of the second trenches are in contact with the N+ substrate.

In a preferred embodiment, in step 2, none of the second trenches is in contact with the N+ substrate, and the distance between the surface of the N+ substrate and the bottom of any one of the second trenches is greater than the thickness of the transition region.

In a preferred embodiment, in step 2, at least one second trench at the outermost of the terminal protection region is not in contact with the N+ substrate; the distance between the surface of the N+ substrate and the bottom of the at least one second trench at the outermost is greater than the thickness of the transition region; the rest of the second trenches are in contact with the N+ substrate.

To achieve the aforementioned objective, the present invention further provides another method for manufacturing superjunction device. The method includes the following steps:

forming a first N-type epitaxial layer on an N+ substrate; the thickness of the first N-type epitaxial layer is greater than or equal to that of a transition region in the first N-type epitaxial layer; forming a plurality of P-type implantation rings in the terminal protection region by implanting a P-type impurity into the first N-type epitaxial layer; the P-type implantation rings are in contact with the N+ substrate;

forming a second N-type epitaxial layer on the first N-type epitaxial layer; forming P-wells in the active region and a P-type ring in the terminal protection region beneath the surface of the second N-type epitaxial layer; forming first trenches and second trenches respectively in the active region and in the terminal protection region in the second N-type epitaxial layer, wherein none of the first trenches is in contact with the N+ substrate; the distance between the surface of the N+ substrate and the bottom of any one of the first trenches is greater than the thickness of the transition region in the first N-type epitaxial layer; the number of the second trenches is greater than or equal to that of the P-type implantation rings; each P-type implantation ring has a second trench formed there-above with the bottom of the second trench contacting therewith; when the number of the second trenches is greater than that of the P-type implantation rings, trenches not in contact with the P-type implantation rings are all situated at the outermost of the terminal protection region and are separated from the N+ substrate by a distance greater than the thickness of the transition region in the first N-type epitaxial layer;

filling the first trenches with a P-type impurity to form P-type pillars and filling the second trenches with a P-type impurity to form P-type annular columns, so as to form alternately arranged P-type and N-type regions respectively in the active region and in the terminal protection region.

To achieve the aforementioned objective, the present invention further provides a superjunction device, which includes an N+ substrate and an N-type epitaxial layer formed on the N+ substrate; a transition region exists in the N-type epitaxial layer and is adjacent to the surface of the N+ substrate; a central area of the superjunction device is defined as an active region, and a peripheral area surrounding the active region is defined as a terminal protection region, wherein the superjunction device further includes: a plurality of parallelly arranged P-type pillars and a plurality of P-type annular columns surrounding the active region; each P-type pillar is formed by a plurality of vertically stacked P-type stripes formed in the N-type epitaxial layer in the active region; the P-type pillars and the N-type epitaxial layer form alternately arranged P-type and N-type regions; each P-type annular column is formed by a plurality of vertically stacked P-type implantation regions formed in the N-type epitaxial layer in the terminal protection region; the P-type annular columns and the N-type epitaxial layer form alternately arranged P-type and N-type regions; wherein none of the P-type pillars in the active region is in contact with the N+ substrate, and the distance between the surface of the N+ substrate and the bottom of any one of the P-type pillars in the active region is greater than the thickness of the transition region.

In a preferred embodiment, none of the P-type annular columns in the terminal protection region is in contact with the N+ substrate, and the distance between the surface of the N+ substrate and the bottom of any one of the P-type annular columns in the terminal protection region is greater than the thickness of the transition region.

In a preferred embodiment, each P-type annular column in the terminal protection region forms a contact with the N+ substrate through a P-type implantation ring formed in the N-type epitaxial layer between the N+ substrate and the bottom of the P-type annular column.

In a preferred embodiment, at least one P-type annular column at the outermost of the terminal protection region is not in contact with the N+ substrate; the distance between the surface of the N+ substrate and the bottom of the at least one P-type annular column at the outermost is greater than the thickness of the transition region; each of the rest of the P-type annular columns in the terminal protection region forms a contact with the N+ substrate through a P-type implantation ring formed in the N-type epitaxial layer between the N+ substrate and the bottom of the P-type annular column.

In a preferred embodiment, the superjunction device may further include P-wells and a P-type ring; the P-wells are formed beneath the surface of the N-type epitaxial layer in the active region; each P-well covers the top of a P-type pillar and surrounds the P-type pillar; the P-type ring is formed beneath the surface of the N-type epitaxial layer in the terminal protection region, and is adjacent to the active region and covers at least one of the P-type annular columns.

In a preferred embodiment, the superjunction device may further include: source regions, formed in each of the P-wells; gate structures, formed above the N-type epitaxial layer, wherein each gate structure corresponds to a P-well and includes from bottom up a gate oxide and a polysilicon gate; a drain electrode, formed at the backside of the N+ substrate; a channel stopper, formed beneath the surface of the N-type epitaxial layer and being close to the outside border of the terminal protection region; a terminal dielectric film, formed on the N-type epitaxial layer in the terminal protection region, having a step structure at a side near the active region, covering the P-type ring and all of the P-type annular columns in the terminal protection region; a polysilicon field plate, formed on the terminal dielectric film and covering a part of the terminal dielectric film which contains the entire step structure; an inter layer film, formed on the N-type epitaxial layer in the terminal protection region, the terminal dielectric film, the polysilicon field plate, and top face and side faces of each gate structure.

To achieve the aforementioned objective, the present invention further provides a method for manufacturing superjunction device. The method includes the following steps:

step 1: forming a first N-type epitaxial layer on an N+ substrate; the thickness of the first N-type epitaxial layer is greater than that of a transition region in the first N-type epitaxial layer; forming a plurality of first P-type stripes in the active region and a plurality of first P-type implantation regions surrounding the active region in the terminal protection region by implanting a P-type impurity into the first N-type epitaxial layer, wherein none of the first P-type stripes or the first P-type implantation regions is in contact with the N+ substrate, and the distance between the surface of the N+ substrate and the bottom of any one of the first P-type stripes or the first P-type implantation regions is greater than the thickness of the transition region in the first N-type epitaxial layer;

step 2: forming a second N-type epitaxial layer on the first N-type epitaxial layer, and forming a plurality of second P-type stripes in the active region and a plurality of second P-type implantation regions surrounding the active region in the terminal protection region by implanting a P-type impurity into the second N-type epitaxial layer, wherein the number of the second P-type stripes is equal to that of the first P-type stripes, and each second P-type stripe is vertically aligned with and in contact with a first P-type stripe; the number of the second P-type implantation regions is equal to that of the first P-type implantation regions, and each second P-type implantation region is vertically aligned with and in contact with a first P-type implantation region;

step 3: repeating step 2 to form a third to an n-th N-type epitaxial layer on the second N-type epitaxial layer in sequence and forming P-type stripes and P-type implantation regions in the respective N-type epitaxial layers until the total thickness of the N-type epitaxial layer formed by the respective N-type epitaxial layers meets the process requirement, wherein the P-type stripes in the respective N-type epitaxial layers are connected from bottom up to form P-type pillars, and the P-type implantation regions in the respective N-type epitaxial layers are connected from bottom up to form P-type annular columns, so as to form alternately arranged P-type and N-type regions respectively in the active region and in the terminal protection region;

step 4: forming P-wells in the active region and a P-type ring in the terminal protection region beneath the surface of the n-th N-type epitaxial layer.

To achieve the aforementioned objective, the present invention further provides another method for manufacturing superjunction device. The method includes the following steps:

step 1: forming a first N-type epitaxial layer on an N+ substrate; the thickness of the first N-type epitaxial layer is greater than or equal to that of a transition region in the first N-type epitaxial layer; forming a plurality of P-type implantation rings surrounding the active region and contacting with the N+ substrate by implanting a P-type impurity into the first N-type epitaxial layer in the terminal protection region;

step 2: forming a second N-type epitaxial layer on the first N-type epitaxial layer; forming a plurality of first P-type stripes in the active region and a plurality of first P-type implantation regions surrounding the active region in the terminal protection region by implanting a P-type impurity into the second N-type epitaxial layer, wherein none of the first P-type stripes in the active region is in contact with the N+ substrate, and the distance between the surface of the N+ substrate and the bottom of any one of the first P-type stripes in the active region is greater than the thickness of the transition region in the first N-type epitaxial layer; the number of the first P-type implantation regions in the terminal protection region is greater than or equal to that of the P-type implantation rings; each P-type implantation ring has a first P-type implantation region formed there-above with the bottom of the first P-type implantation region contacting therewith; when the number of the first P-type implantation regions is greater than that of the P-type implantation rings, first P-type implantation regions not in contact with the P-type implantation rings are all situated at the outermost of the terminal protection region and are separated from the N+ substrate by a distance greater than the thickness of the transition region in the first N-type epitaxial layer;

step 3: forming a third N-type epitaxial layer on the second N-type epitaxial layer; forming a plurality of second P-type stripes in the active region and a plurality of second P-type implantation regions in the terminal protection region by implanting a P-type impurity into the third N-type epitaxial layer, wherein the number of the second P-type stripes is equal to that of the first P-type stripes, and each second P-type stripe is vertically aligned with and in contact with a first P-type stripe; the number of the second P-type implantation regions is equal to that of the first P-type implantation regions, and each second P-type implantation region is vertically aligned with and in contact with a first P-type implantation region;

step 4: repeating step 3 to form a fourth to an n-th N-type epitaxial layer on the third N-type epitaxial layer in sequence and forming P-type stripes and P-type implantation regions in the respective N-type epitaxial layers until the total thickness of the N-type epitaxial layer formed by the respective N-type epitaxial layers meets the process requirement, wherein the P-type stripes in the respective N-type epitaxial layers are connected from bottom up to form P-type pillars and the P-type implantation regions in the respective N-type epitaxial layers are connected from bottom up to form P-type annular columns, so as to form alternately arranged P-type and N-type regions respectively in the active region and in the terminal protection region;

step 5: forming P-wells in the active region and a P-type ring in the terminal protection region beneath the surface of the n-th N-type epitaxial layer.

By separating the bottoms of the P-type pillars in the active region from the N+ substrate by a distance greater than the thickness of the transition region in the N-type epitaxial layer, the present invention is able to improve the uniformity of reverse breakdown voltage and overshoot current handling capability of the devices and thereby improving the overall reverse breakdown voltage and overshoot current handling capability of the devices.

BRIEF DESCRIPTION OF THE DRAWINGS

The present invention will be further described and specified in combination with the drawings and embodiments below.

DETAILED DESCRIPTION

In the following descriptions, the term "inner side" is used to indicate a side close to the center of the device in the horizontal direction, while "outer side" is used to indicate a side away from the center of the device in the horizontal direction.

Figure 1:
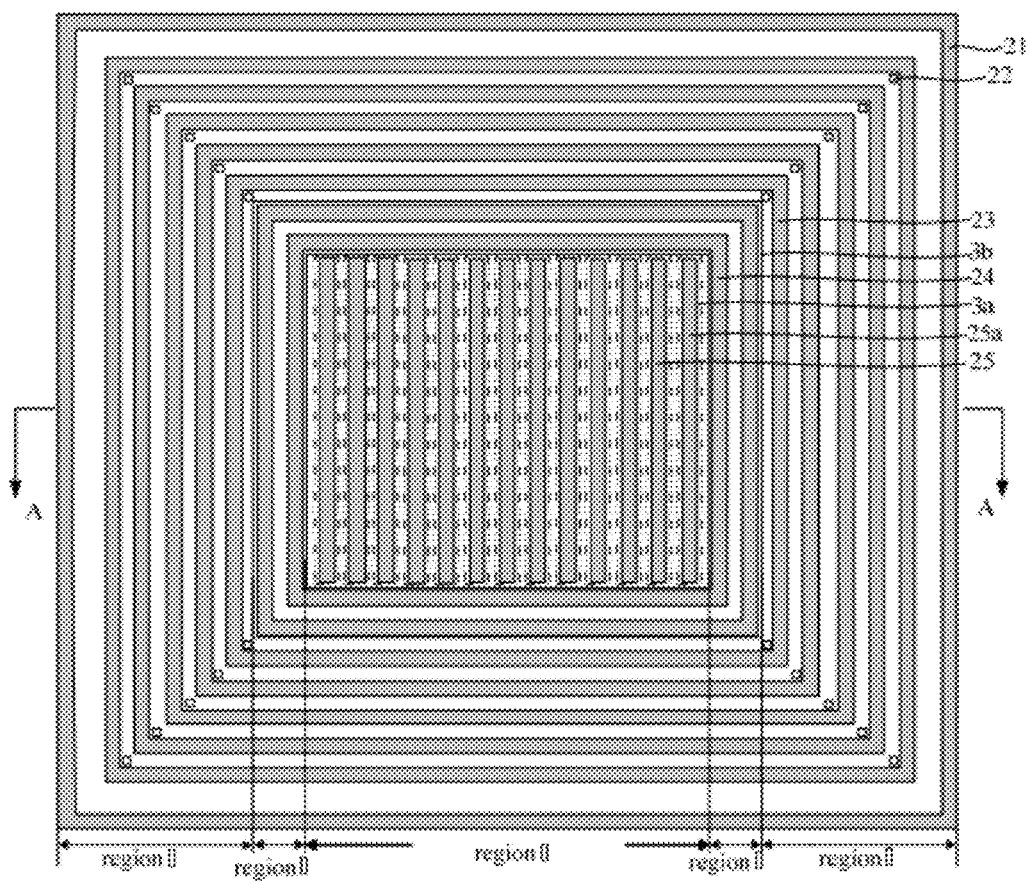
FIG. 1 is a top view of the superjunction device according to a preferred embodiment of the present invention.

FIG. 1 is a top view of the superjunction device according to a preferred embodiment of the present invention. It should be mentioned that FIG. 1 is a top view taken from the top of the N-type epitaxial layer 2, namely those elements above the epitaxial layer 2 are not shown in FIG. 1, although included in the superjunction device. As shown in FIG. 1, the superjunction device of the present invention is divided into three regions, region I, region II and region III. Also refer to FIG. 3, region I, namely a central region of the superjunction device, is defined as an active region of the device. The active region includes alternately arranged P-type regions 25 and N-type regions formed in an N-type epitaxial layer 2. The P-type regions 25 are P-type pillars formed in the active region, and the N-type regions are N-type pillars formed in the active region. In the active region, currents flow through N-type regions, from source electrode via channels to drain electrode. When the device is in a reverse off-state, the P-type regions 25 and the N-type regions form depletion regions to withstand voltage. Regions II and III constitute a terminal protection region of the superjunction device. When the superjunction device is in an on-state, the terminal protection region does not provide current path; when the superjunction device is in a reverse off-state, regions II and III withstand both a voltage in the lateral direction between the outermost unit of region I (namely the P-type region 25a at the border of region I) and the outside border of the superjunction device, and a voltage in the vertical direction between the surface of the outermost unit of region I and the substrate. Region II contains at least one P-type ring 3b, which is generally electrically connected with P-wells 3a in region I. Only one P-type ring 3b is illustrated in FIG. 1. Region II further contains a polysilicon field plate 8b and a metal field plate 13a for preventing rapid changes in surface electric field. Region II also contains P-type annular columns 24. In some embodiments, region II may not contain metal field plate 13a. Region III is a voltage withstanding region formed by alternately arranged P-type annular columns 23 and N-type annular columns formed by the N-type epitaxial layer, wherein the P-type annular columns 23 are P-type regions formed in the terminal protection region, and the N-type annular columns are N-type regions formed in the terminal protection region. Region III may either contain metal field plates 13a, 13b or not. A channel stopper 21 is arranged at the outside border of region III. The channel stopper 21 may be formed by an N+ implantation region, or an N+ implantation region with a dielectric or with a dielectric and a metal formed on it. Additional P-type pillars 22 may be optionally formed at the corners of the P-type annular columns 23 to achieve better charge balance. As shown in FIG. 1, all the structures in the active region, namely the P-type regions 25 and N-type regions, are pillar-shaped. The terminal protection region surrounds the active region, and the P-type ring 3b, P-type annular columns 24, P-type annular columns 23, and channel stopper 21 all have a cross section of straight-flanked ring shape or straight-flanked ring shape with curved corners. In FIG. 1, the P-type regions 25 in the active region all have a cross section of stripe shape. The active region may also be formed by two-dimensionally arranged P-type regions of square, hexagonal, octagonal or other shapes.

The additional P-type pillars 22 at the corner areas in FIG. 1 can be designed according to the requirement of optimizing local electric charge balance. If the width of a P-type annular column 23 is a, and the distance between two adjacent P-type annular columns 23 is also a, then the additional P-type pillars 22 can be designed as P-type square holes with a length of 0.3 a~0.5 a.

Figure 2:
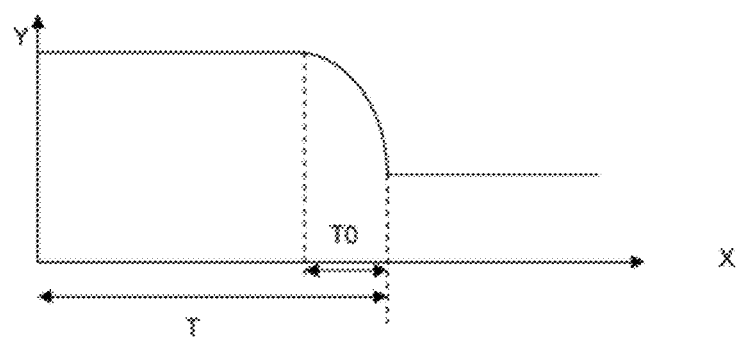
FIG. 2 is a schematic view of a resistivity curve from the N-type epitaxial layer to the N+ substrate of a superjunction device.

FIG. 2 is a schematic view of a resistivity curve from the N-type epitaxial layer to the N+ substrate of a superjunction device. After the superjunction device of this embodiment is formed, a transition region exists in the N-type epitaxial layer 2 adjacent to the surface of the N+ substrate 1. The doping concentration of the transition region is lower than that of the N+ substrate 1 and is higher than that of the N-type epitaxial layer 2. The resistivity of the transition region is higher than that of the N+ substrate 1 and is lower than that of the N-type epitaxial layer 2. The N+substrate 1 is evenly doped with a doping concentration higher than $1E19\ cm^{-3}$, and the doping concentration of the N-type epitaxial layer 2 is lower than $5E16\ cm^{-3}$. During the high-temperature process of epitaxial deposition and other high-temperature processes after epitaxy, such as drive-in, trench refilling and gate oxidation processes, the impurity in the N+ substrate 1 will diffuse into the N-type epitaxial layer 2, thereby forming a transition region having a continuous concentration gradient in the N-type epitaxial layer 2. As shown in FIG. 2, the X-axis indicates the position coordinates from the surface of the N-type epitaxial layer 2 toward the bottom of the N+ substrate 1. The Y-axis indicates the changes in resistivity. The thickness of the N-type epitaxial layer 2 is T, and the thickness of the transition region is T0. The resistivity in the transition region continuously declines.

Figure 3:
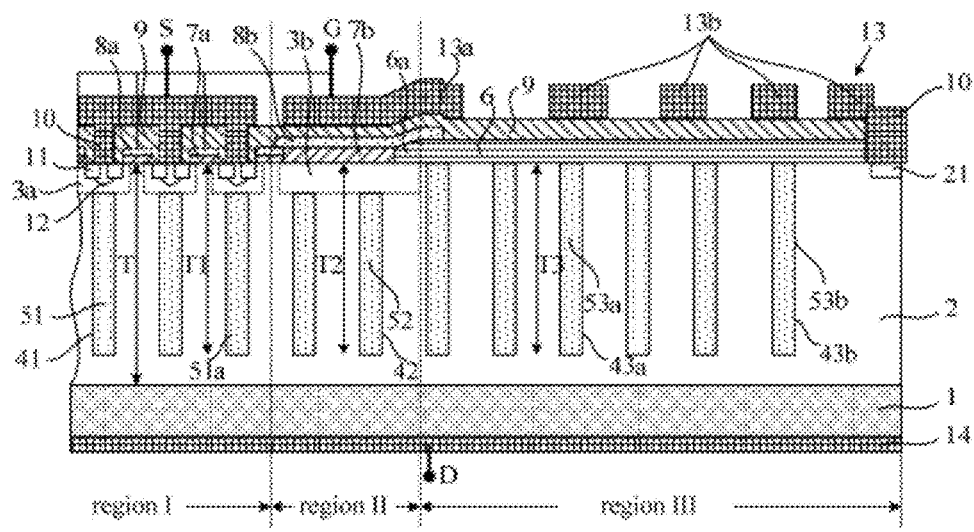
FIG. 3 to FIG. 10 are cross-sectional views of the superjunction devices according to Embodiments 1 to 8 of the present invention.

FIG. 3 is a cross sectional view of the superjunction device according to Embodiment 1 along the line A-A in FIG. 1. In this embodiment, an N-type epitaxial layer 2 is formed on an N+ substrate 1. A transition region (not shown) exists in the N-type epitaxial layer 2 adjacent to the surface of the N+ substrate 1. Region I, which is in a central area of the superjunction device, is an active region and includes alternately arranged P-type regions 25 and N-type regions formed in the N-type epitaxial layer 2. The P-type regions 25 are constituted of P-type pillars 51 formed in the first trenches 41 in region I in FIG. 3. The first trenches 41 may have a cross sectional shape of rectangular, square, hexagonal, octagonal, etc. A P-well 3a is formed beneath the surface of each P-type region 25 and may extend laterally into the N-type regions on both sides of the P-type region 25. Source regions 11 formed by N+ implantation regions are respectively formed in each of the P-wells 3a. Gate structures are formed above the N-type epitaxial layer 2. Each gate structure corresponds to a P-well 3a and includes a gate oxide 7a and a polysilicon gate formed on the gate oxide 7a. The gate oxide 7a is formed on the surface of the N-type epitaxial layer 2 in the active region. A metal layer 13 is formed above the N-type epitaxial layer 2 and is connected to the polysilicon gates 8a or the source regions 11 through contact holes 10 to pick up gate electrodes or source electrodes. P+ ion implantation regions 12 are formed to build ohmic contacts between the P-wells 3a and the metal layer 13. A backside metal layer 14 is formed at the backside of the N+ substrate 1 to pick up a drain electrode.

Regions II and III constitute the terminal protection region of the superjunction device according to Embodiment 1 of the present invention. The terminal protection region surrounds the active region and includes at least one P-type ring 3b, a plurality of P-type annular columns 24 in region II, a plurality of P-type annular columns 23 in region III, a channel stopper 21, a terminal dielectric film 6, at least one polysilicon field plate 8b, and metal field plates 13a and 13b. In other embodiments, the terminal protection region may not include metal field plates 13a or 13b. In Embodiment 1, five metal field plates (one 13a and four 13b) are included in total.

The P-type annular columns 24 are constituted of P-type annular columns 52 formed in the second trenches 42 in region II. The P-type annular columns 23 include P-type annular columns 53a formed in the second trenches 43a at the inner side of region III, and P-type annular columns 53b formed in the second trenches 43b at the outer side of region III. All the second trenches 42, 43a, 43b may have a cross sectional shape of straight-flanked ring or straight-flanked ring with curved corners. The P-type pillars 51 and the P-type annular columns 52, 53a, 53b are formed by filling a P-type silicon into the respective trenches 42, 43a, 43b. P-type annular columns 52, 53a and 53b are arranged in order between the outermost P-type region 25 in the active region, namely the P-type pillar 51a, and the channel stopper 21.

The P-type pillars 51, P-type annular columns 52, 53a, 53b and the adjacent N-type epitaxial layer 2 form a plurality of alternately arranged P-type and N-type regions. As shown in FIG. 3, assuming that the thickness of the N-type epitaxial layer 2 is T, the thickness of the transition region in the N-type epitaxial layer 2 is T0 (referring to FIG. 2), the distance from the bottom of any one of the P-type pillars 51 to the upper surface of the N-type epitaxial layer 2 is T1, the distance from the bottom of any one of the P-type annular columns 52 to the upper surface of the N-type epitaxial layer 2 is T2, and the distance from the bottom of any one of the P-type annular columns 53a, 53b to the upper surface of the N-type epitaxial layer 2 is T3, then the distances from the bottoms of P-type pillars 51 or the P-type annular columns 52, 53a, 53b to the surface of the N+ substrate 1 are all greater than the thickness of the transition region, namely T−T1>T0, T−T2>T0, and T−T3>T0.

The superjunction device according to Embodiment 1 of the present invention is a device having a breakdown voltage (BVDS) of 600V. The N+ substrate 1 has a resistivity of from 0.001 Ω·cm to 0.003 Ω·cm and a doping concentration of higher than 1E19 cm$^{-3}$; the N-type epitaxial layer 2 has a thickness T of 45 μm and a resistivity of 4 Ω·cm. After the whole process, the thickness T0 of the transition region in the N-type epitaxial layer 2 formed due to the impurity diffusion from the N+ substrate 1 to the N-type epitaxial layer 2 is about 5 μm. T1, T2 and T3 are 35 μm, equal to one another. The distances between the N+ substrate 1 and the bottoms of the P-type pillars 51 or P-type annular columns 52, 53a, 53b, namely the distances between the N+ substrate 1 and the bottoms of all the P-type regions, are all 10 μm, which is greater than the thickness of the transition region (5 μm).

The P-type ring 3b is formed beneath the surface of the N-type epitaxial layer 2 in region II in the terminal protection region and is adjacent to the outermost P-type pillar 51a in region I. The P-type ring 3b covers a plurality of P-type annular columns 52. The doping concentration of the P-type ring 3b is greater than that of the P-type annular columns 52. The P-type ring 3b covers at least one P-type annular column 52 closest to the active region (i.e. closest to the P-type pillar 51a) and its adjacent N-type annular column The P-type ring 3b and P-wells 3a are formed under the same process conditions, in other words, the P-type ring 3b and the P-wells 3a are simultaneously implanted. The P-type ring 3b may also be implanted separately by a single implantation.

The channel stopper 21 is formed beneath the surface of the N-type epitaxial layer 2 at the outer side of the outermost P-type annular column 53b.

The terminal dielectric film 6 is formed on the N-type epitaxial layer 2 in the terminal protection region. The terminal dielectric film 6 has a step structure 6a at the side close to the active region. The terminal dielectric film 6 covers all the P-type annular columns from the P-type annular column under the step structure 6a to the P-type annular column 23 at the outermost.

The polysilicon field plate 8b is formed on the terminal dielectric film 6 and covers a part of the terminal dielectric film 6, wherein the part of the terminal dielectric film 6 includes the entire step structure 6a. The polysilicon field plate 8b extends toward the inner side of the device to cover the N-type epitaxial layer 2 between the outside border of the active region and the step structure 6a. The extension part of the polysilicon field plate 8b covers one or more of the P-type annular columns 24. The extension part of the polysilicon field plate 8b is isolated from the N-type epitaxial layer 2 below it by the gate oxide 7a and a second dielectric layer 7b. The second dielectric layer 7b has a thickness greater than that of the gate oxide 7a and covers all the P-type annular columns 52 in region II. The polysilicon field plate 8b is electrically connected with the polysilicon gates 8a.

An inter layer film 9 is formed on the N-type epitaxial layer 2 in the terminal protection region, on the terminal dielectric film 6, on the polysilicon field plate 8b, and also on the top face and side faces of each gate structure. In regions II and III, a plurality of metal field plates 13a and 13b (five in total in this embodiment) are formed on the inter layer film 9. Metal field plates 13a and 13b are formed by lithographing and etching a metal layer 13. The metal field plates 13a and 13b are respectively formed on the inter layer film 9 above the P-type ring 3b or above the P-type annular columns 53a, 53b or above the channel stopper 21. The metal field plate 13a covers the entire step structure 6a. The metal field plate 13a is separated from the source electrode and is not connected to the source electrode. A part of the metal field plate 13a covers the entire P-type ring 3b. The metal field plate 13a is formed above the polysilicon field plate 8b and may either be connected to the polysilicon field plate 8b through contact holes 10 or not connected to the polysilicon field plate 8b. All the metal field plates 13a and 13b have a floating structure.

The thickness of the gate oxide 7a is from 800 Å to 1200 Å; the thicknesses of the polysilicon field plate 8b and polysilicon gates 8a are from 3000 Å to 10000 Å; the thickness of the terminal dielectric film 6 is from 5000 Å to 15000 Å and the thickness of the inter layer film 9 is from 5000 Å to 15000 Å.

The stepping of the alternately arranged P-type and N-type regions below the P-type ring 3b in region II, namely the intervals between adjacent trenches in region II is smaller than or equal to the stepping of the alternately arranged P-type and N-type regions in region I. The width ratio of P-type and N-type regions in region II (the ratio of P-type region's width to N-type region's width) is greater than or equal to that in region I. In this embodiment, the widths of P-type regions in regions I, II and III are all 5 μ and the widths of N-type regions in regions I, II and III are all 10 μm.

The alternately arranged P-type and N-type regions formed by P-type annular columns 53a, 53b and the N-type epitaxial layer in region III are used as a voltage withstanding region. Metal field plates 13a and 13b are formed above the P-type and N-type annular columns in region III. A polysilicon field plate may either be formed above the P-type and N-type annular columns in region III or not. A P-type ring may either be formed in region III or not.

The channel stopper 21 at the outermost of region III is formed by an N+ implantation region, or an N+ implantation region with a metal formed on it. The N+ implantation region of the channel stopper 21 is formed by the same process as the source regions 11. In Embodiment 1, a metal field plate 13b is formed above the channel stopper 21 and is connected to the channel stopper 21 through a contact hole 10. In other embodiments, the channel stopper 21 may not be connected to the metal field plate 13b so that the metal field plate 13b will be floating. The metal field plate 13b may also be substituted by a polysilicon field plate. In Embodiment 1, no polysilicon field plate is arranged.

Figure 4:
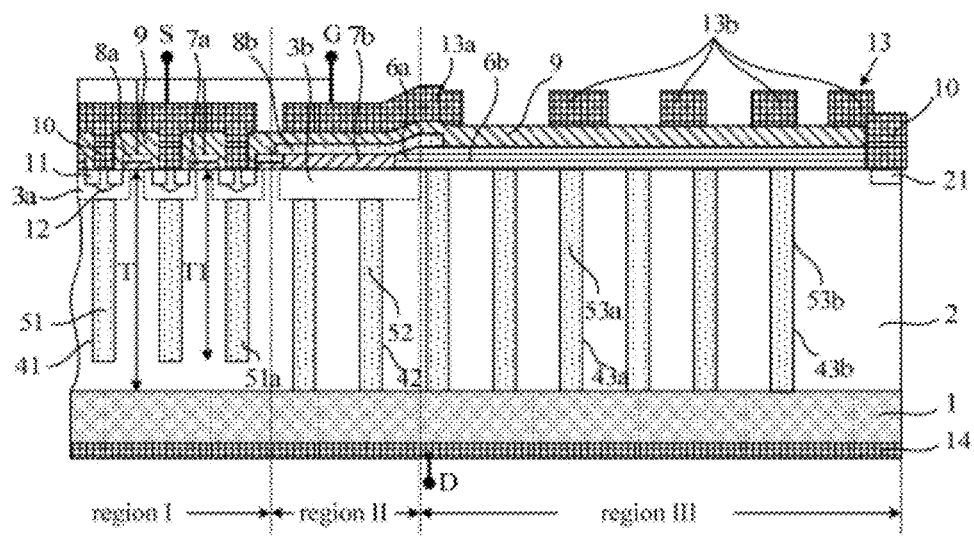

FIG. 4 is a cross sectional view of the superjunction device according to Embodiment 2 along the line A-A in FIG. 1. The difference between Embodiment 2 and Embodiment 1 is that: in Embodiment 2, the bottoms of the trenches 42 in region II and the bottoms of the trenches 43a, 43b in region III are in contact with the N+ substrate 1, so that after the filling of P-type silicon into the trenches, the P-type annular columns 52, 53a, 53b all pass through the N-type epitaxial layer 2 and are in contact with the N+ substrate 1, while the bottoms of the P-type pillars 51 do not pass through the N-type epitaxial layer 2 and are not in contact with the N+ substrate 1, and the distance between the bottom of any one of the P-type pillars 51 and the surface of the N+ substrate 1 is greater than the thickness of the transition region in the N-type epitaxial layer 2. Wherein, the distance from the bottoms of the P-type pillars 51 to the surface of the N-type epitaxial layer 2, namely T1, is 35 μm, and the thickness of the N-type epitaxial layer 2, namely T, is 45 μm.

Figure 5:
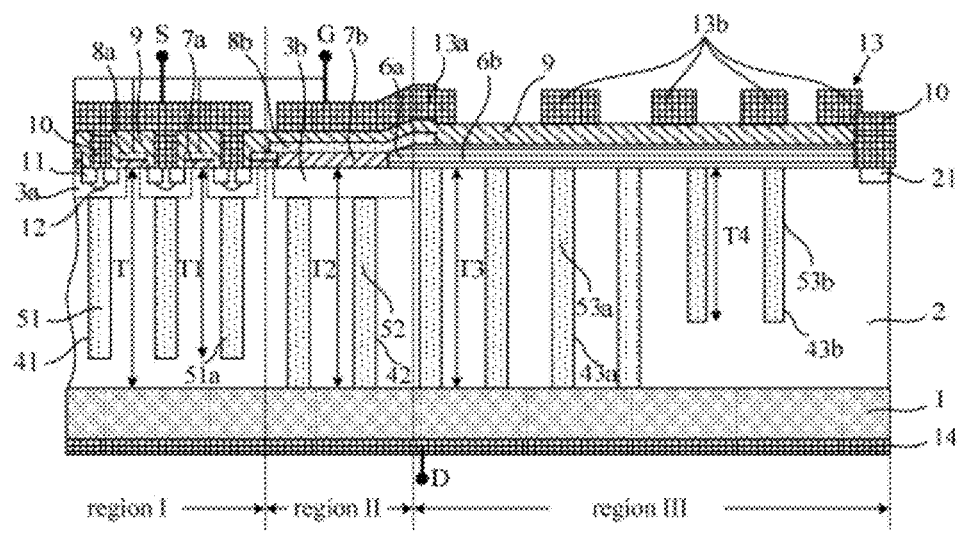

FIG. 5 is a cross sectional view of the superjunction device according to Embodiment 3 along the line A-A in FIG. 1. The difference between Embodiment 3 and Embodiment 2 is that: in Embodiment 3, the bottoms of the two trenches 43b at the outermost, namely closest to the outside border of the terminal protection region, are not in contact with the N+ substrate 1. The depth T4 of the trenches 43b, namely the distance from the bottoms of the trenches 43b to the surface of the N-type epitaxial layer 2, is smaller than the thickness T of the N-type epitaxial layer 2, and is also smaller than T2 and T3. After the filling of P-type silicon into the trenches, the P-type annular columns 53b formed in the trenches 43b have a depth smaller than that of the adjacent P-type annular column 53a. This makes sure that the PN junction at the outermost of region III is a graded junction, and thereby increasing the breakdown voltage at the terminal end.

Figure 6:
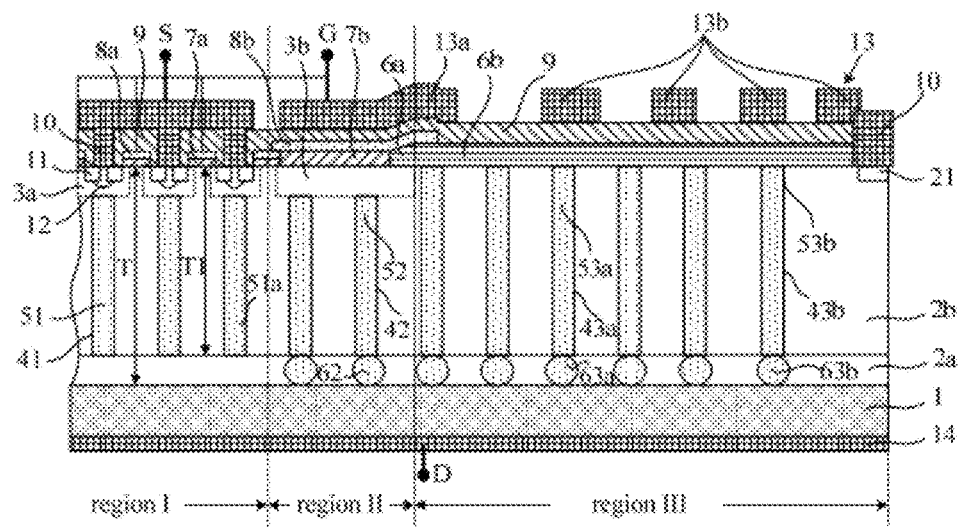

FIG. 6 is a cross-sectional view of the superjunction device according to Embodiment 4 along the line A-A in FIG. 1. The difference between Embodiment 4 and Embodiment 1 is that: in Embodiment 4, each P-type annular column in the terminal protection region forms a contact with the N+ substrate 1 through a P-type implantation ring formed in the N-type epitaxial layer between the N+ substrate and the bottom of the corresponding P-type annular column.

More specifically, in this embodiment, the N-type epitaxial layer 2 is formed by a first N-type epitaxial layer 2a and a second N-type epitaxial layer 2b, wherein the first N-type epitaxial layer 2a is situated at the bottom of the second N-type epitaxial layer 2b, and the first N-type epitaxial layer 2a has a thickness greater than or equal to the thickness of the transition region in the N-type epitaxial layer 2.

Each P-type region in the terminal protection region is formed from bottom up by a P-type implantation ring and a P-type annular column; P-type regions in the active region are formed of P-type pillars. The P-type implantation rings are formed by P-type implantation into the first N-type epitaxial layer 2a. The P-type implantation rings include P-type implantation rings 62, 63a, 63b formed in different regions, wherein the P-type implantation rings 62 are formed in region II; the P-type implantation rings 63a are formed at the inner side of region III, namely the side close to region II; and the P-type implantation rings 63b are formed at the outer side of region III. All the P-type implantation rings 62, 63a and 63b are formed through the first N-type epitaxial layer 2a and are in contact with the N+ substrate 1. The P-type impurity implanted into the P-type implantation rings 62, 63a and 63b may be B, BF$_2$ or other P-type impurities. The P-type implantation rings 62, 63a and 63b may be formed by ion implantation with an implantation energy of 5 KEV to 500 KEV and an implantation dose of 1E14 cm$^{-2}$ to 1E16 cm$^{-2}$. The implantation can be performed by one-time or be performed by multiple times under different conditions.

P-type pillars 51 are formed by filling a P-type impurity into the trenches 41 in region I; P-type annular columns 52 are formed by filling a P-type impurity into the trenches 42 in region II; P-type annular columns 53a are formed by filling a P-type impurity into the trenches 43a at the inner side of region III; and P-type annular columns 53b are formed by filling a P-type impurity into the trenches 43b at the outer side of region III; wherein the bottoms of the P-type annular columns 52, 53a and 53b all pass through the second N-type epitaxial layer 2b and connect with the respective P-type implantation rings 62, 63a and 63b to form contact with the N+ substrate 1 through the P-type implantation rings 62, 63a and 63b. And therefore, the P-type regions in region I are constituted by the P-type pillars 51; the P-type regions in region II are constituted by the P-type annular columns 52 and the corresponding P-type implantation rings 62; the P-type regions in region III are constituted by the P-type annular columns 63a, 63b and the corresponding P-type implantation rings 63a, 63b.

As the bottoms of the P-type pillars 51 are separated from the surface of the N+ substrate 1 by the first N-type epitaxial layer 2a, the distance between the bottom of any one of the P-type pillars 51 and the surface of the N+ substrate 1 is greater than the thickness of the transition region in the first N-type epitaxial layer 2a.

Figure 7:
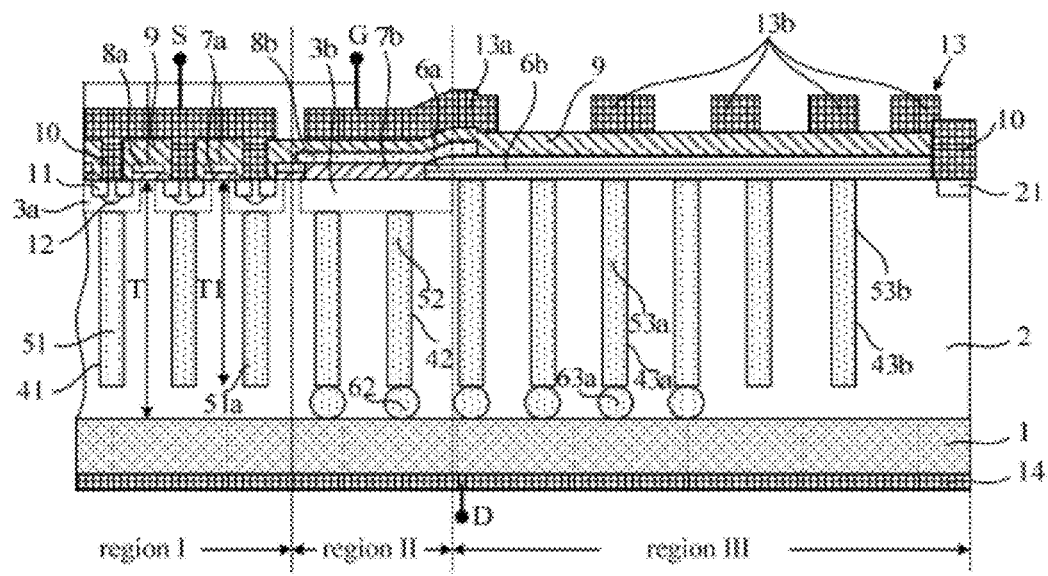

FIG. 7 is a cross-sectional view of the superjunction device according to Embodiment 5 along the line A-A in FIG. 1. The difference between Embodiment 5 and Embodiment 4 is that: in Embodiment 5, the two P-type regions at the outermost of region III are just formed by P-type annular columns 53b, namely the two P-type regions at the outermost of region III do not contain the P-type implantation rings 63b in FIG. 6.

Figure 8:
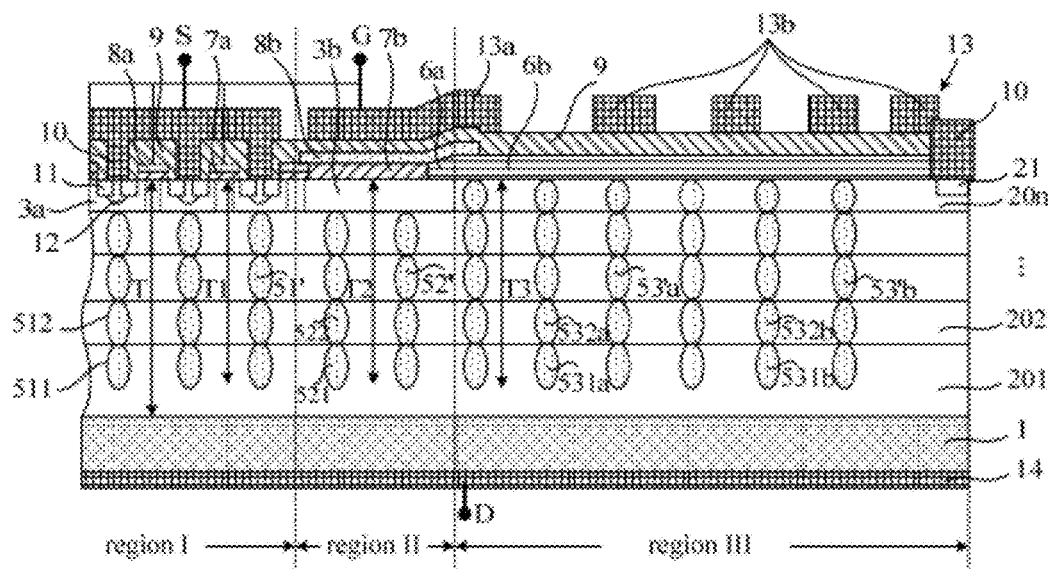

FIG. 8 is a cross-sectional view of the superjunction device according to Embodiment 6 along the line A-A in FIG. 1. The difference between Embodiment 6 and Embodiment 1 is that: no trenches are formed in the N-type epitaxial layer 2; each P-type pillar is formed by a plurality of vertically stacked P-type stripes formed in the N-type epitaxial layer 2 in the active region; and each P-type annular column is formed by a plurality of vertically stacked P-type implantation regions formed in the N-type epitaxial layer 2 in the terminal protection region.

More specifically, in this embodiment, the N-type epitaxial layer 2 is formed of a plurality of stacked N-type epitaxial layers 201, 202, ..., 20n; the P-type pillars 51' in the active region, namely in region I, are formed by a plurality of vertically stacked P-type stripes 511, 512, ...; the P-type annular columns 52', 53'a, 53'b in the terminal protection region, namely in regions II and III, are formed by a plurality of vertically stacked P-type implantation regions 521, 522, ...; 531a, 532a, ...; 531b, 532b, ...; the distance between the bottom of any one of the P-type pillars 51' or the P-type annular columns 52', 53'a, 53'b and the surface of the N+ substrate 1 is greater than the thickness of the transition region.

The P-type pillars 51' and the P-type annular columns 52', 53'a, 53'b may be formed by ion implantation into the respective N-type epitaxial layers 201, 202, ..., 20n with an implantation energy of 5 KEV to 500 KEV and an implantation dose of $1E14\ cm^{-2}$ to $1E16\ cm^{-2}$. The P-type impurity implanted into the P-type pillars 51' and the P-type annular columns 52', 53'a, 53'b may be B, $BF_2$ or other P-type impurities. The implantation can be carried out for one-time or for multiple times with different conditions.

Figure 9:
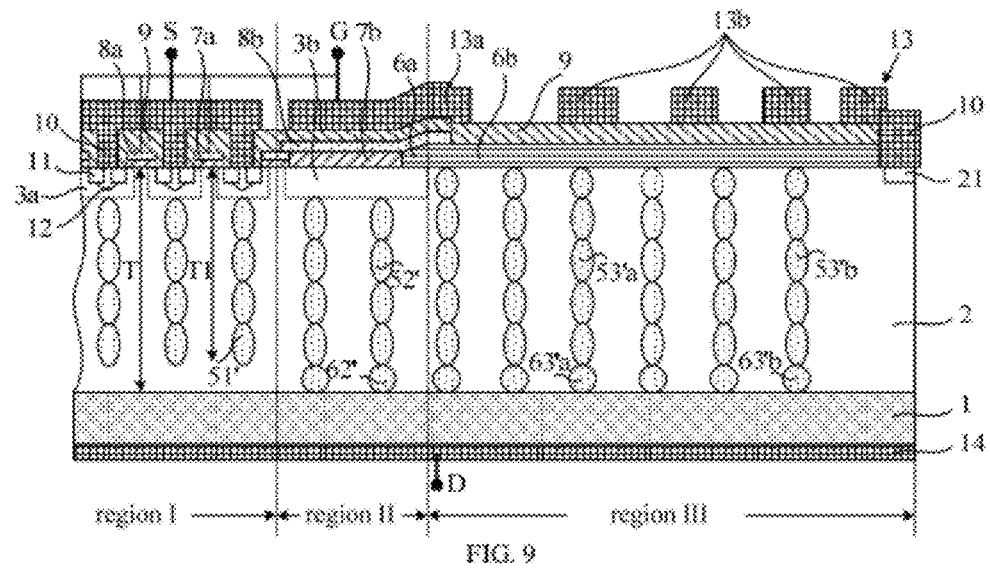

FIG. 9 is a cross-sectional view of the superjunction device according to Embodiment 7 along the line A-A in FIG. 1. The difference between Embodiment 7 and Embodiment 6 is that: in Embodiment 7, each of the P-type annular columns forms a contact with the N+ substrate 1 through a P-type implantation ring formed in the N-type epitaxial layer 2 between the N+ substrate 1 and the bottom of the corresponding P-type annular column.

More specifically, in this embodiment, the P-type pillars 51', namely P-type regions in region I, are formed by a plurality of stacked P-type stripes; each of the P-type regions in regions II and III is formed by a P-type implantation ring 62', 63'a or 63'b and a corresponding P-type annular column 52', 53'a or 53'b formed by a plurality of stacked P-type implantation regions. The P-type implantation rings 62', 63'a and 63'b are formed in the lowest N-type epitaxial layer (namely the N-type epitaxial layer at the bottom) and are connected to the N+ substrate 1, so that all the P-type regions in regions II and III are in contact with the N+ substrate 1.

Figure 10:
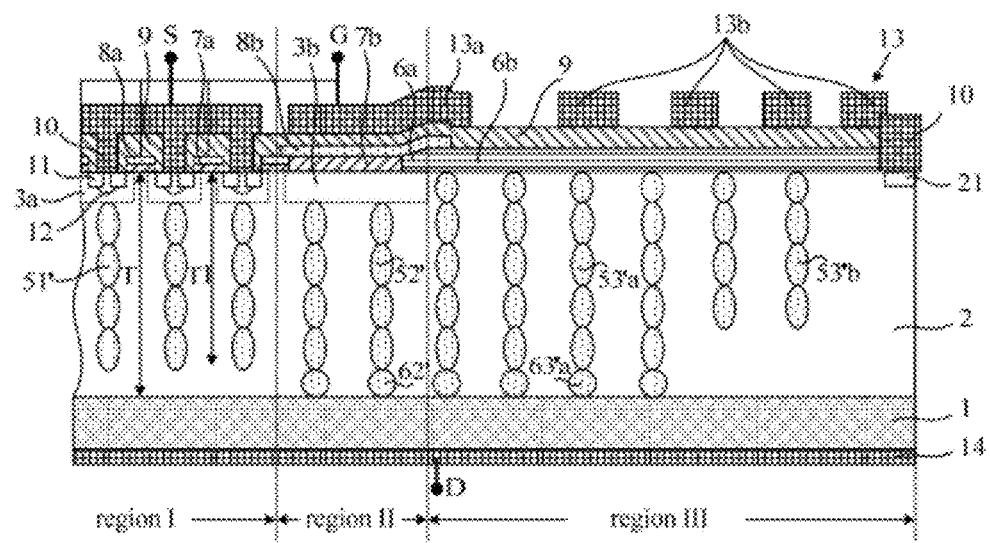

FIG. 10 is a cross-sectional view of the superjunction device according to Embodiment 8 along the line A-A in FIG. 1. The difference between Embodiment 8 and Embodiment 7 is that in Embodiment 8, the P-type regions at the outermost of region III do not include the P-type implantation rings 63b in the lowest N-type epitaxial layer or the P-type implantation regions in the second lowest N-type epitaxial layer (see FIG. 9), so that the bottoms of the two P-type annular columns 53b at the outermost of region III are separated from the N+ substrate 1 by a certain distance.

Referring to FIG. 3 to FIG. 5, the method for manufacturing the superjunction devices according to Embodiments 1 to 3 of the present invention includes:

Step 1: form an N-type epitaxial layer 2 on an N+ substrate 1; form P-wells 3a in the active region, namely in region I, and a P-type ring 3b in the terminal protection region beneath the surface of the N-type epitaxial layer 2; the N-type epitaxial layer 2 has a thickness T of about 45 μm; the N+ substrate 1 has a resistivity of from 0.001 Ω·cm to 0.003 Ω·cm; the N+ substrate 1 has a doping concentration higher than $1E19\ cm^{-3}$.

Step 2: form first trenches and second trenches in the N-type epitaxial layer 2 respectively in the active region and in the terminal protection region; none of the first trenches in the active region is in contact with the N+ substrate 1; the distance between the surface of the N+ substrate 1 and the bottom of any one of the first trenches 41 in the active region is greater than the thickness of the transition region; wherein the first trenches are constituted by trenches 41 in region I, which are formed in the N-type epitaxial layer 2 in the active region; the second trenches are constituted by trenches 42 in region II and trenches 43a, 43b in region III, which are formed in the N-type epitaxial layer 2 in the terminal protection region; none of the trenches 41 in region I is in contact with the N+ substrate 1, and the distance between the bottom of any one of the trenches 41 in region I and the surface of the N+ substrate 1 is greater than the thickness T0 of the transition region in the N-type epitaxial layer 2, wherein T0 is about 5 μm.

As shown in FIG. 3, the depth T1 of the trenches 41 in region I, the depth T2 of the trenches 42 in region II and the depths T3 of the trenches 43a, 43b in region III are all about 35 μm. The distances from the bottoms of trenches 41 in region I, trenches 42 in region II and trenches 43a, 43b in region III to the surface of the N+ substrate 1 are all about 10 μm. The mask for producing trench patterns in the active region and in the terminal protection region during the lithography process is designed such that the widths of the trenches both in the active region and in the terminal protection region are set to a same value of 5 μm, and the intervals between adjacent trenches, namely the steppings of alternately arranged P-type and N-type regions, are set to be 10 μm.

As shown in FIG. 4, the trenches 41 in region I have a depth T1 of about 35 μm. The bottoms of the trenches 42 in region II and trenches 43a, 43b in region III are all in contact with the N+ substrate 1. Trenches of two different depths can be achieved through a microloading effect in etching, namely by setting different lateral widths and steppings for trenches 41 in the active region (i.e. region I) and trenches in the terminal protection region (i.e. regions II and III) in the lithography process. For example, the lateral width and stepping of the trenches 41 in region I are respectively set to be 5 μm and 10 μm; the lateral width and stepping of the trenches 42 in region II and trenches 43a, 43b in region III are respectively set to be 7 μm and 14 μm; the interval between the trench at the innermost of region II and the trench at the outermost of region I is 12 μm; due to the microloading effect in etching, when the trenches 41 of 5 μm wide is etched to a depth of 35 μm, the depths of the trenches 42, 43a, 43b of 7μm wide have already exceeded 46 μm and have formed contact with the N+ substrate 1.

As shown in FIG. 5, the superjunction device includes trenches of three different depths, wherein the trenches 41 in region I have a depth T1 of about 35 μm; the bottoms of the trenches 42 in region II and trenches 43a in region III are all in contact with the N+ substrate 1, while the bottoms of the two trenches 43b at the outermost of region III are not in contact with the N+ substrate 1. The two trenches 43b in region III have a depth T4 smaller than the depth T2 of any one of the trenches 42 in region II and the depth T3 of any one of the trenches 43a in region III, wherein T2 and T3 are equal to T. Trenches of three different depths can be achieved through the microloading effect in etching, namely by setting different lateral widths and steppings for trenches in the active region and trenches in the terminal protection region in the lithography process. For example, the lateral width and stepping of the trenches 41 in region I are set to be 5 μm and 10 μm, respectively; the lateral width and stepping of the trenches 42 in region II and trenches 43a in region III are set to be 7 μm and 14 μm, respectively; the interval between the trench at the innermost of region II and the trench at the outermost of region I is 12 μm; the lateral width and stepping of the two outermost trenches 43b in region III are set to be 3 μm and 3 μm, respectively; the interval between the outermost trench 43a and its adjacent trench 43b is 8.5 μm; due to the microloading effect in etching, when the trenches 41 of 5 μm wide is etched to a depth of 35 μm, the depths of the trenches 42, 43a of 7 μm wide have already exceeded 46 μm and have formed contact with the N+ substrate 1, meanwhile, the depth of the trenches 43b at the outermost is merely 20 μm, so that the PN junction at the outermost will be a graded junction, thereby increasing the breakdown voltage of the device at the terminal end.

Step 3: fill the trenches 41 in region I with a P-type silicon to form P-type pillars 51; fill the trenches 42 in region II and trenches 43a, 43b in region III with a P-type silicon to form P-type annular columns 52, 53a and 53b; and then remove the silicon above the surface of the N-type epitaxial layer 2 to form alternately arranged P-type and N-type regions both in the active region and in the terminal protection region, wherein the P-type regions include the P-type pillars 51 and the P-type annular columns 52, 53a and 53b.

Step 4: deposit a dielectric film and remove part of the dielectric film in region I by lithography and etch to form a terminal dielectric film 6 in the terminal protection region, wherein the terminal dielectric film 6 has a step structure 6a at the side near the active region; deposit another dielectric film to form a second dielectric layer 7b in the terminal protection region by lithography and etch, wherein the second dielectric layer 7b is formed on the N-type epitaxial layer 2 between the outside border of the active region and the step structure 6a; the second dielectric layer 7b has a thickness greater than the gate oxide 7a to be formed in subsequent process; the second dielectric layer 7b at least covers the central region of the P-type regions covered by the polysilicon field plate 8b to be formed in subsequent process; in FIG. 3 to FIG. 5, the second dielectric layer 7b covers all the P-type annular columns 52 in region II.

Step 5: form a gate oxide 7a and a polysilicon layer in sequence on the structure after steps 1 to 4, namely on the second dielectric layer 7b, the terminal dielectric film 6 and the P-type and N-type regions not covered by the second dielectric layer 7b or the terminal dielectric film 6; form polysilicon gates 8a in the active region and at least one polysilicon field plate 8b in the terminal protection region by etching the polysilicon layer. The polysilicon field plate 8b covers the entire step structure 6a and a part of the terminal dielectric film 6 and extends above the N-type epitaxial layer 2 between the outside border of the active region and the step structure 6a. The extension part of the polysilicon field plate 8b covers one or more P-type regions, namely the P-type annular columns 52 in region II. The bottom of the polysilicon field plate 8b is isolated from the N-type epitaxial layer 2 by the gate oxide 7a and the second dielectric layer 7b.

Step 6: form source regions 11 and a channel stopper 21 by lithography and ion implantation.

Step 7: deposit an inter layer film 9.

Step 8: form contact holes 10 by lithography and etch.

Step 9: form ohmic contacts 12 between the P-wells 3a and the metal layer 13 to be formed in subsequent process by P+ ion implantation.

Step 10: deposit a metal layer 13 on the above structure and form a source electrode, a drain electrode and a plurality of metal field plates 13a, 13b by lithography and etch. The metal field plates 13a and 13b are formed on the inter layer film 9 respectively above the P-type ring 3b and above the P-type annular columns 23, namely the P-type annular columns 52, 53a and 53b, wherein the metal field plate 13a covers the entire step structure 6a. When no metal field plates 13a and 13b are arranged in regions II and III, the step of forming metal field plates 13a and 13b can be omitted.

Step 11: perform backside grinding to reduce the thickness of the N+ substrate 1.

Step 12: deposit a metal layer 14 on the backside of the N+ substrate 1 and form a drain electrode.

Referring to FIG. 6 and FIG. 7, the method for manufacturing the superjunction devices according to Embodiments 4 and 5 of the present invention includes:

Step 1: form a first N-type epitaxial layer 2a on an N+ substrate 1, wherein the first N-type epitaxial layer 2a has a thickness greater than or equal to the thickness T0 of the transition region in the first N-type epitaxial layer 2a, wherein T0 is 5 μm; the N+ substrate 1 has a resistivity of from 0.001 Ω·cm to 0.003 Ω·cm and a doping concentration higher than $1E19$ $cm^{-3}$; implant a P-type impurity into the first N-type epitaxial layer 2a in the terminal protection region to form a plurality of P-type implantation rings in contact with the N+ substrate 1, wherein the P-type impurity may be B, $BF_2$ or other P-type impurities; the P-type implantation rings may be formed by ion implantation with an implantation energy of 5 KEV to 500 KEV and an implantation dose of $1E14$ $cm^{-2}$ to $1E16$ $cm^{-2}$; the implantation may be performed by one-time or by multiple times with different conditions.

As shown in FIG. 6, P-type implantation rings 62, 63a and 63b are formed in regions II and III; no P-type implantation ring is formed in region I. Wherein, the P-type implantation rings 62 are formed in region II; the P-type implantation rings 63a are formed at the inner side of region III, namely the side close to region II; and the P-type implantation rings 63b are formed at the outer side of region III. All the P-type implantation rings 62, 63a and 63b are formed through the first N-type epitaxial layer 2a and are in contact with the N+ substrate 1.

As shown in FIG. 7, no P-type implantation ring is formed in region I and the outer side of region III, namely the side far from region II; P-type implantation rings are formed in both region II and at the inner side of region III, namely the side close to region II, so that only P-type implantation rings 62 and 63a in region II and at the inner side of region III exist.

Step 2: form a second N-type epitaxial layer 2b on the first N-type epitaxial layer 2a, wherein the first N-type epitaxial layer 2a and the second N-type epitaxial layer 2b constitute the N-type epitaxial layer 2; the thickness of the N-type epitaxial layer 2 maintains to be about 45 μm; form P-wells 3a in the active region and a P-type ring 3b in the terminal protection region beneath the surface of the second N-type epitaxial layer 2b; form first trenches 41 and second trenches 42, 43a, 43b in the second N-type epitaxial layer 2b respectively in the active region and in the terminal protection region, wherein none of the first trenches 41 in the active region is in contact with the N+ substrate 1, and the distance between the bottom of any one of the first trenches 41 in the active region and the surface of the N+ substrate 1 is greater than the thickness of the transition region in the first N-type epitaxial layer 2a. The number of the second trenches 42, 43a, 43b in the terminal protection region is greater than or equal to the number of the P-type implantation rings (in FIG. 6, the number of the second trenches 42, 43a and 43b is equal to the number of the P-type implantation rings 62, 63a and 63b; in FIG. 7, the number of the second trenches 42, 43a and 43b is greater than the number of the P-type implantation rings 62 and 63a). Each P-type implantation ring has a second trench formed above it with the bottom of the second trench contacting with it, namely in FIG. 6, each of the P-type implantation rings 62, 63a, 63b has a corresponding trench 42, 43a, 43b formed above it and connecting to it; in FIG. 7, each of the P-type implantation rings 62, 63a has a corresponding trench 42, 43a formed above it and connecting to it. In the case that the number of second trenches is greater than that of the P-type implantation rings, namely in the case as shown in FIG. 7, all those trenches 43b not in contact with P-type implantation rings are situated at the outermost of the terminal protection region; the bottom of these trenches 43b are not in contact with the N+ substrate 1, and the distance between the bottoms of the trenches 43b and the surface of the N+ substrate 1 is greater than the thickness of the transition region in the first N-type epitaxial layer 2a. Wherein, the first trenches in the active region include the trenches 41 formed in region I; the second trenches 42 in the terminal protection region include the trenches 42 in region II and the trenches 43a, 43b in region III.

As shown in FIG. 6, the bottom of each of the trenches 42 in region II or trenches 43a, 43b in region III is in contact with a P-type implantation ring, namely in contact with the corresponding P-type implantation ring 62, 63a or 63b. Since no P-type implantation rings are formed at the bottoms of the trenches 41 in region I, the bottoms of the trenches 41 in region I are not in contact with the N+ substrate 1.

As shown in FIG. 7, the bottom of each of the trenches 42 in region II or trenches 43a in region III is in contact with a P-type implantation ring, namely in contact with the corresponding P-type implantation ring 62 or 63a. Since no P-type implantation rings are formed at the bottoms of the trenches 41 in region I, the bottoms of the trenches 41 in region I are not in contact with the N+ substrate 1. Since no P-type implantation rings 63b are formed, the bottoms of the trenches 43b in region III are not in contact with the N+ substrate 1.

Step 3: fill the trenches 41 in the active region with a P-type silicon to form P-type pillars 51, and fill the trenches 42, 43a, 43b in the terminal protection region with a P-type silicon to form P-type annular columns 52, 53a, 53b. P-type regions are formed by P-type annular columns and the corresponding P-type implantation rings connected to the bottom of the P-type annular columns at wherever P-type implantation rings are formed; P-type regions are formed by P-type annular columns only at wherever no P-type implantation rings are formed. Thereby, alternately arranged P-type and N-type regions are formed in the active region and in the terminal protection region.

Step 4: deposit a dielectric film and remove part of the dielectric film in region I by lithography and etch to form a terminal dielectric film 6 in the terminal protection region, wherein the terminal dielectric film 6 has a step structure 6a at the side near the active region; deposit another dielectric film to form a second dielectric layer 7b in the terminal protection region by lithography and etch, wherein the second dielectric layer 7b is formed on the N-type epitaxial layer 2 between the outside border of the active region and the step structure 6a; the second dielectric layer 7b has a thickness greater than the gate oxide 7a to be formed in subsequent process; the second dielectric layer 7b at least covers the central region of the P-type regions covered by the polysilicon field plate 8b to be formed in subsequent process; in FIG. 6 and FIG. 7, the second dielectric layer 7b covers all the P-type annular columns 52 in region II.

Step 5: form a gate oxide 7a and a polysilicon layer in sequence on the structure after steps 1 to 4, namely on the second dielectric layer 7b, the terminal dielectric film 6 and the P-type and N-type regions not covered by the second dielectric layer 7b or the terminal dielectric film 6; form polysilicon gates 8a in the active region and at least one polysilicon field plate 8b in the terminal protection region by etching the polysilicon layer. The polysilicon field plate 8b covers the entire step structure 6a and a part of the terminal dielectric film 6 and extends above the N-type epitaxial layer 2 between the outside border of the active region and the step structure 6a. The extension part of the polysilicon field plate 8b covers one or more P-type regions, namely the P-type annular columns 52 in region II. The bottom of the polysilicon field plate 8b is isolated from the N-type epitaxial layer 2 by the gate oxide 7a and the second dielectric layer 7b.

Step 6: form source regions 11 and a channel stopper 21 by lithography and ion implantation.

Step 7: deposit an inter layer film 9.

Step 8: form contact holes 10 by lithography and etch.

Step 9: form ohmic contacts 12 between the P-wells 3a and the metal layer 13 to be formed in subsequent process by P+ ion implantation.

Step 10: deposit a metal layer 13 on the above structure and form a source electrode, a drain electrode and a plurality of metal field plates 13a, 13b by lithography and etch. The metal field plates 13a and 13b are formed on the inter layer film 9 respectively above the P-type ring 3b and above the P-type annular columns 23, namely the P-type annular columns 52, 53a and 53b, wherein the metal field plate 13a covers the entire step structure 6a. Since the metal field plates 13a and 13b may be omitted in regions II and III, when no metal field plates 13a and 13b are arranged, the step of forming metal field plates 13a and 13b can be omitted.

Step 11: perform backside grinding to reduce the thickness of the N+ substrate 1.

Step 12: deposit a metal layer 14 on the backside of the N+ substrate 1 and form a drain electrode.

Referring to FIG. 8, the method for manufacturing the superjunction device according to Embodiment 6 of the present invention includes:

Step 1: form a first N-type epitaxial layer 201 on an N+ substrate 1, wherein the first N-type epitaxial layer 201 has a thickness of 18 μm, which is greater than the thickness of the transition region in the first N-type epitaxial layer (5 μm); the N+ substrate 1 has a resistivity of from 0.001 Ω·cm to 0.003 Ω·cm and a doping concentration higher than 1E19 cm-3; implant a P-type impurity into the first N-type epitaxial layer 201 to form a plurality of first P-type stripes 511 in the active region and a plurality of first P-type implantation regions 521, 531a and 531b surrounding the active region in the terminal protection region, wherein none of the P-type stripes 511 or the first P-type implantation regions 521, 531a and 531b are in contact with the N+ substrate; the distance between the bottom of any one of the P-type stripes 511 or the first P-type implantation regions 521, 531a, 531b and the surface of the N+ substrate is greater than the thickness of the transition region in the first N-type epitaxial layer 201.

Step 2: form a second N-type epitaxial layer 202 having a thickness of 7 μm on the first N-type epitaxial layer 201;

implant a P-type impurity into the second N-type epitaxial layer 202 to form a plurality of second P-type stripes 512 in the active region and a plurality of second P-type implantation regions 522, 532a and 532b surrounding the active region in the terminal protection region. The number of the second P-type stripes 512 is equal to the number of the first P-type stripes 511; each second P-type stripe 512 is vertically aligned with a first P-type stripe 511 and is in contact with the corresponding first P-type stripe 511. The number of the second P-type implantation regions 522, 532a and 532b is equal to the number of the first P-type implantation regions 521, 531a and 531b; each second P-type implantation region 522, 532a, 532b is vertically aligned with a first P-type implantation regions 521, 531a, 531b and is in contact with the corresponding first P-type implantation region.

Step 3: form a third to an n-th N-type epitaxial layer 203~20n (n is a natural number) on the second N-type epitaxial layer 202 in sequence and form P-type stripes and P-type implantation regions in the respective N-type epitaxial layers 203~20n until the total thickness of the N-type epitaxial layer 2 formed by the respective N-type epitaxial layers 201~20n meets the requirement of the process. In Embodiment 6, the total thickness T of the N-type epitaxial layer 2 is 45 µm, so that step 2 an be repeated for three times to form N-type epitaxial layers 203, 204 and 205 (reference numbers not shown in FIG. 8); the thicknesses of the N-type epitaxial layers 203, 204 and 205 may be 7 µm, 7 µm and 6 µm, respectively. The P-type stripes in the respective N-type epitaxial layers 201~20n (n=5) are connected from bottom up to form P-type pillars 51', and the P-type implantation regions in the respective N-type epitaxial layers 201~20n (n=5) are connected from bottom up to form P-type annular columns 52', 53'a and 53b, thereby forming alternately arranged P-type and N-type regions both in the active region and in the terminal protection region. As shown in FIG. 8, the P-type pillars 51' in region I are stacked by the respective P-type stripes 511, 512, . . . in the N-type epitaxial layer 2; the P-type annular columns 52' in region II and the P-type annular columns 53'a, 53'b in region III are stacked by the respective P-type implantation regions 521, 522, . . . ; 531a, 532a, . . . ; and 531b, 532b, . . . in the N-type epitaxial layer 2. The depth of the P-type pillars 51' in region I is T1; the depth of the P-type annular columns 52' in region II is T2; the depths of the P-type annular columns 53'a and 53'b in region III are respectively T3 and T4; all of T1~T4 are more than 5 µm smaller than the total thickness T of the N-type epitaxial layer 2.

Step 4: form P-wells 3a in the active region and a P-type ring 3b in the terminal protection region beneath the surface of the n-th (in Embodiment 6 , n=5) N-type epitaxial layer.

Step 5: deposit a dielectric film and remove part of the dielectric film in region I by lithography and etch to form a terminal dielectric film 6 in the terminal protection region, wherein the terminal dielectric film 6 has a step structure 6a at the side near the active region; deposit another dielectric film to form a second dielectric layer 7b in the terminal protection region by lithography and etch, wherein the second dielectric layer 7b is formed on the N-type epitaxial layer 2 between the outside border of the active region and the step structure 6a; the second dielectric layer 7b has a thickness greater than the gate oxide 7a to be formed in subsequent process; the second dielectric layer 7b at least covers the central region of the P-type regions covered by the polysilicon field plate 8b to be formed in subsequent process; in FIG. 8, the second dielectric layer 7b covers all the P-type annular columns 52' in region II.

Step 6: form a gate oxide 7a and a polysilicon layer in sequence on the structure after steps 1 to 5, namely on the second dielectric layer 7b, the terminal dielectric film 6 and the P-type and N-type regions not covered by the second dielectric layer 7b or the terminal dielectric film 6; form polysilicon gates 8a in the active region and at least one polysilicon field plate 8b in the terminal protection region by etching the polysilicon layer. The polysilicon field plate 8b covers the entire step structure 6a and a part of the terminal dielectric film 6 and extends above the N-type epitaxial layer 2 between the outside border of the active region and the step structure 6a. The extension part of the polysilicon field plate 8b covers one or more P-type regions, namely the P-type annular columns 52' in region II. The bottom of the polysilicon field plate 8b is isolated from the N-type epitaxial layer 2 by the gate oxide 7a and the second dielectric layer 7b.

Step 7: form source regions 11 and a channel stopper 21 by lithography and ion implantation.

Step 8: deposit an inter layer film 9.

Step 9: form contact holes 10 by lithography and etch.

Step 10: form ohmic contacts 12 between the P-wells 3a and the metal layer 13 to be formed in subsequent process by P+ ion implantation.

Step 11: deposit a metal layer 13 on the above structure and form a source electrode, a drain electrode and a plurality of metal field plates 13a, 13b by lithography and etch. The metal field plates 13a and 13b are formed on the inter layer film 9 respectively above the P-type ring 3b and above the P-type annular columns 23, namely the P-type annular columns 52', 53'a and 53'b, wherein the metal field plate 13a covers the entire step structure 6a. Since the metal field plates 13a and 13b may be omitted in regions II and III, when no metal field plates 13a and 13b are arranged, the step of forming metal field plates 13a and 13b can be omitted.

Step 12: perform backside grinding to reduce the thickness of the N+ substrate 1.

Step 13: deposit a metal layer 14 on the backside of the N+ substrate 1 and form a drain electrode.

Referring to FIG. 9 and FIG. 10, the method for manufacturing the superjunction devices according to Embodiments 7 and 8 of the present invention includes:

Step 1: form a first N-type epitaxial layer on an N+ substrate 1, wherein the first N-type epitaxial layer has a thickness of 10 µm, which is greater than or equal to the thickness of the transition region in the first N-type epitaxial layer (5 µm); the N+ substrate 1 has a resistivity of from 0.001 Ω·cm to 0.003 Ω·cm and a doping concentration higher than 1E19 $cm^{-3}$; implant a P-type impurity into the first N-type epitaxial layer to form a plurality of P-type implantation rings surrounding the active region and contacting with the N+ substrate 1, wherein the P-type impurity may be B, $BF_2$ or other P-type impurities; the P-type implantation rings may be formed by ion implantation with an implantation energy of 5 KEV to 500 KEV and an implantation dose of 1E14 $cm^{-2}$ to 1E16 $cm^{-2}$; the implantation may be performed by one-time or by multiple times with different conditions.

As shown in FIG. 9, P-type implantation rings are defined and formed in regions II and III, while no P-type implantation rings are defined in region I, wherein P-type implantation rings 62' are formed in region II; P-type implantation rings 63'a are formed at the inner side of region III, namely the side close to region II; P-type implantation rings 63b are formed at the outer side of region III. The P-type implantation rings 62', 63'a and 63b are all formed through the first N-type epitaxial layer and are in contact with the N+ substrate 1.

As shown in FIG. 10, no P-type implantation rings are defined in region I and at the outer side of region III, namely the side far from region II, while P-type implantation rings 62' and 63'a are formed in region II and at the inner side of region III.

Step 2: form a second N-type epitaxial layer having a thickness of 8 μm on the first N-type epitaxial layer; implant a P-type impurity into the second N-type epitaxial layer to form a plurality of first P-type stripes in the active region and a plurality of first P-type implantation regions surrounding the active region in the terminal protection region, wherein none of the first P-type stripes in the active region is in contact with the N+ substrate 1; the distance between the bottom of any one of the first P-type stripes and the surface of the N+ substrate 1 is greater than the thickness of the transition region in the first N-type epitaxial layer. The number of the first P-type implantation regions in the terminal protection region is equal to the number of the P-type implantation rings; each first P-type implantation region is connected to the N+ substrate 1 through the corresponding P-type implantation ring. The P-type impurity may be B, $BF_2$ or other P-type impurities; the first P-type stripes and the first P-type implantation regions may be formed by ion implantation with an implantation energy of 5 KEV to 500 KEV and an implantation dose of $1E14\ cm^{-2}$ to $1E16\ cm^{-2}$; the implantation can be performed by one-time or by multiple times with different conditions.

As shown in FIG. 9, the first P-type stripes are formed in the second N-type epitaxial layer in region I, and the first P-type implantation regions are formed in the second N-type epitaxial layer in both regions II and III. The bottoms of the first P-type stripes in region I are separated from the N+ substrate 1 by a distance greater than the thickness of the transition region in the first N-type epitaxial layer, wherein the thickness of the transition region is 5 μm. The first P-type implantation regions in regions II and III are in contact with the N+ substrate 1 through the P-type implantation rings 62', 63'*a* and 63'*b* formed in the layer under the first P-type implantation regions.

As shown in FIG. 10, the first P-type stripes are formed in the second N-type epitaxial layer in region I. The first P-type implantation regions are formed in the second N-type epitaxial layer in region II and at the inner side of region III; no first P-type implantation regions are formed at the outer side of region III. The bottoms of the P-type stripes in region I are separated from the N+ substrate 1 by a distance greater than the thickness of the transition region in the first N-type epitaxial layer, wherein the thickness of the transition region is 5 μm. The first P-type implantation regions in region II and at the inner side of region III are in contact with the N+ substrate 1 through the P-type implantation rings 62' and 63'*a* formed in the layer under the first P-type implantation regions.

Step 3: form a third N-type epitaxial layer having a thickness of 7 μm on the second N-type epitaxial layer; implant a P-type impurity into the third N-type epitaxial layer to form a plurality of second P-type stripes in the active region and a plurality of second P-type implantation regions surrounding the active region in the terminal protection region, wherein the number of the second P-type stripes is equal to the number of the first P-type stripes; each second P-type stripe is vertically aligned with a first P-type stripe and is in contact with the corresponding first P-type stripe; the number of the second P-type implantation regions is greater than or equal to the number of the first P-type implantation regions; each first P-type implantation region has a second P-type implantation region formed above it with the bottom of the second P-type implantation region contacting with it. In the case that the number of the second P-type implantation regions is greater than the number of the first P-type implantation regions, those second P-type implantation regions not in contact with first P-type implantation regions are all situated at the outermost of the terminal protection region and are separated from the N+ substrate 1 by a distance greater than the thickness of the transition region in the first N-type epitaxial layer. The P-type impurity may be B, $BF_2$ or other P-type impurities; the first P-type stripes and the first P-type implantation regions may be formed by ion implantation with an implantation energy of 5 KEV to 500 KEV and an implantation dose of $1E14\ cm^{-2}$ to $1E16\ cm^{-2}$; the implantation can be performed by one-time or by multiple times with different conditions.

As shown in FIG. 9, the second P-type stripes are formed in the third N-type epitaxial layer in region I, and the second P-type implantation regions are formed in the third N-type epitaxial layer in both regions II and III. Each of the second P-type stripes is vertically aligned with a first P-type stripe and is in contact with the corresponding first P-type stripe; each of the second P-type implantation regions is vertically aligned with a first P-type implantation region and is in contact with the corresponding first P-type implantation region.

As shown in FIG. 10, the second P-type stripes are formed in the third N-type epitaxial layer in region I, and the second P-type implantation regions are formed in the third N-type epitaxial layer in both regions II and III. Each of the second P-type stripes is vertically aligned with a first P-type stripe and is in contact with the corresponding first P-type stripe. Each of the second P-type implantation regions in region II and at the inner side of region III is vertically aligned with a first P-type implantation region and is in contact with the corresponding first P-type implantation region, while the bottoms of the second P-type implantation regions at the outer side of region III are not in contact with any one of the first P-type implantation regions; the distance between the bottoms of the second P-type implantation regions at the outer side of region III and the surface of the N+ substrate 1 is greater than the thickness of the transition region in the first N-type epitaxial layer.

Step 4: form a fourth to an n-th N-type epitaxial layer on the third N-type epitaxial layer in sequence, and form P-type stripes and P-type implantation regions in the respective N-type epitaxial layers until the total thickness of the N-type epitaxial layer 2 formed by the respective N-type epitaxial layers meets the requirement of the process. In Embodiments 7 and 8, the total thickness T of the N-type epitaxial layer 2 is 45 μm, so that step 3 can be repeated for three times to form the fourth to the sixth N-type epitaxial layers; the thicknesses of the fourth to the sixth N-type epitaxial layers may be 7 μm, 7 μm and 6 μm, respectively. The P-type stripes in the respective N-type epitaxial layers are connected from bottom up to form the P-type pillars 51', and the P-type implantation regions in the respective N-type epitaxial layers are connected from bottom up to form P-type annular columns 52', 53'*a* and 53'*b*, wherein the P-type annular columns 52', 53'*a* and 53'*b* may form contact with the N+ substrate 1 through the corresponding P-type implantation rings 62', 63'*a* and 63'*b* formed under them, thereby forming alternately arranged P-type and N-type regions both in the active region and in the terminal protection region.

As shown in FIG. 9, each of the P-type regions in region I is constituted by a P-type pillar 51' stacked by the P-type stripes in the respective layers; each of the P-type regions in region II is constituted by a P-type annular column 52' stacked by the P-type implantation regions in the respective layers and the corresponding P-type implantation ring 62' formed below the P-type annular column 52'; each of the P-type regions at the inner side of region III is constituted by a P-type annular column 53'*a* stacked by the P-type implantation regions in the respective layers and the corresponding P-type implantation ring 63'*a* formed below the P-type annular column 53'*a*; each of the P-type regions at the outer side of region III is constituted by a P-type annular column 53'b stacked by the P-type implantation regions in the respective layers and the corresponding P-type implantation ring 63'b formed below the P-type annular column 53b.

As shown in FIG. 10, each of the P-type regions in region I is constituted by a P-type pillar 51' stacked by the P-type stripes in the respective layers; each of the P-type regions in region II is constituted by a P-type annular column 52' stacked by the P-type implantation regions in the respective layers and the corresponding P-type implantation ring 62' formed below the P-type annular column 52'; each of the P-type regions at the inner side of region III is constituted by a P-type annular column 53'a stacked by the P-type implantation regions in the respective layers and the corresponding P-type implantation ring 63'a formed below the P-type annular column 53'a; each of the P-type regions at the outer side of region III is constituted by a P-type annular column 53'b stacked by the P-type implantation regions in the respective layers.

Step 5: form P-wells 3a in the active region and a P-type ring 3b in the terminal protection region beneath the surface of the n-th (in Embodiments 7 and 8, n=6) N-type epitaxial layer.

Step 6: deposit a dielectric film and remove part of the dielectric film in region I by lithography and etch to form a terminal dielectric film 6 in the terminal protection region, wherein the terminal dielectric film 6 has a step structure 6a at the side near the active region; deposit another dielectric film to form a second dielectric layer 7b in the terminal protection region by lithography and etch, wherein the second dielectric layer 7b is formed on the N-type epitaxial layer 2 between the outside border of the active region and the step structure 6a; the second dielectric layer 7b has a thickness greater than the gate oxide 7a to be formed in subsequent process; the second dielectric layer 7b at least covers the central region of the P-type regions covered by the polysilicon field plate 8b to be formed in subsequent process; in FIG. 9 and FIG. 10, the second dielectric layer 7b covers all the P-type annular columns 52' in region II.

Step 7: form a gate oxide 7a and a polysilicon layer in sequence on the structure after steps 1 to 6, namely on the second dielectric layer 7b, the terminal dielectric film 6 and the P-type and N-type regions not covered by the second dielectric layer 7b or the terminal dielectric film 6; form polysilicon gates 8a in the active region and at least one polysilicon field plate 8b in the terminal protection region by etching the polysilicon layer. The polysilicon field plate 8b covers the entire step structure 6a and a part of the terminal dielectric film 6 and extends above the N-type epitaxial layer 2 between the outside border of the active region and the step structure 6a. The extension part of the polysilicon field plate 8b covers one or more P-type regions, namely the P-type annular columns 52' in region II. The bottom of the polysilicon field plate 8b is isolated from the N-type epitaxial layer 2 by the gate oxide 7a and the second dielectric layer 7b.

Step 8: form source regions 11 and a channel stopper 21 by lithography and ion implantation.

Step 9: deposit an inter layer film 9.

Step 10: form contact holes 10 by lithography and etch.

Step 11: form ohmic contacts 12 between the P-wells 3a and the metal layer 13 to be formed in subsequent process by P+ ion implantation.

Step 12: deposit a metal layer 13 on the above structure and form a source electrode, a drain electrode and a plurality of metal field plates 13a, 13b by lithography and etch. The metal field plates 13a and 13b are formed on the inter layer film 9 respectively above the P-type ring 3b and above the P-type annular columns 23, namely the P-type annular columns 52', 53'a and 53b, wherein the metal field plate 13a covers the entire step structure 6a. Since the metal field plates 13a and 13b may be omitted in regions II and III, when no metal field plates 13a and 13b are arranged, the step of forming metal field plates 13a and 13b can be omitted.

Step 13: perform backside grinding to reduce the thickness of the N+ substrate 1.

Step 14: deposit a metal layer 14 on the backside of the N+ substrate 1 and form a drain electrode.

Although the present invention has been described in considerable detail with reference to certain preferred embodiments thereof, the disclosure is not for limiting the scope of the present invention. Persons having ordinary skill in the art may make various modifications and changes without departing from the scope and spirit of the present invention. Therefore, the scope of the appended claims should not be limited to the description of the preferred embodiments described above.

What is claimed is:

1. A superjunction device, comprising an N+ substrate and an N-type epitaxial layer formed on the N+ substrate, a transition region existing in the N-type epitaxial layer and being adjacent to a surface of the N+ substrate, a central area of the superjunction device being defined as an active region, a peripheral area of the superjunction device surrounding the active region being defined as a terminal protection region, wherein the superjunction device further comprises:
   a plurality of parallelly arranged first trenches formed in the N-type epitaxial layer in the active region, a P-type impurity being filled into the first trenches to form a plurality of P-type pillars, the P-type pillars and the N-type epitaxial layer forming alternately arranged P-type and N-type regions; and
   a plurality of second trenches surrounding the active region formed in the N-type epitaxial layer in the terminal protection region, a P-type impurity being filled into the second trenches to form a plurality of P-type annular columns, the P-type annular columns and the N-type epitaxial layer forming alternately arranged P-type and N-type regions;
   wherein none of the P-type pillars in the active region is in contact with the N+ substrate, and a distance between the surface of the N+ substrate and a bottom of any one of the P-type pillars in the active region is greater than a thickness of the transition region.

2. The superjunction device according to claim 1, wherein all of the P-type annular columns in the terminal protection region are in contact with the N+ substrate.

3. The superjunction device according to claim 1, wherein none of the P-type annular columns in the terminal protection region is in contact with the N+ substrate, and a distance between the surface of the N+ substrate and a bottom of any one of the P-type annular columns in the terminal protection region is greater than the thickness of the transition region.

4. The superjunction device according to claim 1, wherein at least one P-type annular column at the outermost of the terminal protection region is not in contact with the N+ substrate, a distance between the surface of the N+ substrate and a bottom of the at least one P-type annular column at the outermost being greater than the thickness of the transition region, the rest of the P-type annular columns in the terminal protection region being in contact with the N+ substrate.

5. The superjunction device according to claim 1, wherein each P-type annular column in the terminal protection region forms a contact with the N+ substrate through a P-type implantation ring formed in the N-type epitaxial layer between the N+ substrate and a bottom of the P-type annular column.

6. The superjunction device according to claim 1, wherein at least one P-type annular column at the outermost of the terminal protection region is not in contact with the N+ substrate, a distance between the surface of the N+ substrate and a bottom of the at least one P-type annular column at the outermost being greater than the thickness of the transition region, each of the rest of the P-type annular columns in the terminal protection region forming a contact with the N+ substrate through a P-type implantation ring formed in the N-type epitaxial layer between the N+ substrate and a bottom of the P-type annular column.

7. The superjunction device according to claim 1, further comprising:
   P-wells, formed beneath a surface of the N-type epitaxial layer in the active region, each P-well covering a top of a P-type pillar and surrounding the P-type pillar; and
   a P-type ring, formed beneath the surface of the N-type epitaxial layer in the terminal protection region, being adjacent to the active region and covering at least one of the P-type annular columns.

8. The superjunction device according to claim 7, further comprising:
   source regions, formed in each of the P-wells;
   gate structures, formed above the N-type epitaxial layer, each gate structure corresponding to a P-well and comprising a gate oxide and a polysilicon gate formed thereon;
   a drain electrode, formed at a backside of the N+ substrate;
   a channel stopper, formed beneath the surface of the N-type epitaxial layer and being close to an outside border of the terminal protection region;
   a terminal dielectric film, formed on the N-type epitaxial layer in the terminal protection region, having a step structure at a side near the active region, covering the P-type ring and all of the P-type annular columns in the terminal protection region;
   a polysilicon field plate, formed on the terminal dielectric film and covering a part of the terminal dielectric film which contains the entire step structure; and
   an inter layer film, formed on the N-type epitaxial layer in the terminal protection region, the terminal dielectric film, the polysilicon field plate, and top face and side faces of each gate structure.

9. A method for manufacturing the superjunction device according to claim 7, comprising:
   step 1: forming an N-type epitaxial layer on an N+ substrate, and forming P-wells in an active region and a P-type ring in a terminal protection region beneath a surface of the N-type epitaxial layer;
   step 2: respectively forming first trenches and second trenches in the N-type epitaxial layer, wherein none of the first trenches is in contact with the N+ substrate, and a distance between a surface of the N+ substrate and a bottom of any one of the first trenches is greater than a thickness of the transition region; and
   step 3: filling the first trenches with a P-type impurity to form P-type pillars and filling the second trenches with a P-type impurity to form P-type annular columns, so as to form alternately arranged P-type and N-type regions respectively in the active region and in the terminal protection region.

10. The method according to claim 9, wherein in step 2, all of the second trenches are in contact with the N+ substrate.

11. The method according to claim 9, wherein in step 2, none of the second trenches is in contact with the N+ substrate, and a distance between the surface of the N+ substrate and a bottom of any one of the second trenches is greater than the thickness of the transition region.

12. The method according to claim 9, wherein in step 2, at least one second trench at the outermost of the terminal protection region is not in contact with the N+ substrate, a distance between the surface of the N+ substrate and a bottom of the at least one second trench at the outermost being greater than the thickness of the transition region, the rest of the second trenches being in contact with the N+ substrate.

13. A method for manufacturing the superjunction device according to claim 7, comprising:
   forming a first N-type epitaxial layer on an N+ substrate, a thickness of the first N-type epitaxial layer being greater than or equal to that of a transition region in the first N-type epitaxial layer; forming a plurality of P-type implantation rings in the terminal protection region by implanting a P-type impurity into the first N-type epitaxial layer, the P-type implantation rings being in contact with the N+ substrate;
   forming a second N-type epitaxial layer on the first N-type epitaxial layer; forming P-wells in the active region and a P-type ring in the terminal protection region beneath a surface of the second N-type epitaxial layer; forming first trenches and second trenches respectively in the active region and in the terminal protection region in the second N-type epitaxial layer, wherein none of the first trenches is in contact with the N+ substrate, a distance between the surface of the N+ substrate and a bottom of any one of the first trenches being greater than a thickness of the transition region in the first N-type epitaxial layer, a number of the second trenches being greater than or equal to that of the P-type implantation rings, each P-type implantation ring having a second trench formed there-above with a bottom of the second trench contacting therewith; when the number of the second trenches is greater than that of the P-type implantation rings, trenches not in contact with the P-type implantation rings are all situated at the outermost of the terminal protection region and are separated from the N+ substrate by a distance greater than the thickness of the transition region in the first N-type epitaxial layer; and
   filling the first trenches with a P-type impurity to form P-type pillars and filling the second trenches with a P-type impurity to form P-type annular columns, so as to form alternately arranged P-type and N-type regions respectively in the active region and in the terminal protection region.

14. A superjunction device, comprising an N+ substrate and an N-type epitaxial layer formed on the N+ substrate, a transition region existing in the N-type epitaxial layer and being adjacent to a surface of the N+ substrate, a central area of the superjunction device being defined as an active region, a peripheral area surrounding the active region being defined as a terminal protection region, wherein the superjunction device further comprises:
   a plurality of parallelly arranged P-type pillars, each P-type pillar being formed by a plurality of vertically stacked P-type stripes formed in the N-type epitaxial layer in the active region, the P-type pillars and the N-type epitaxial layer forming alternately arranged P-type and N-type regions; and
   a plurality of P-type annular columns surrounding the active region, each P-type annular column being formed by a plurality of vertically stacked P-type implantation regions formed in the N-type epitaxial layer in the terminal protection region, the P-type annular columns and the N-type epitaxial layer forming alternately arranged P-type and N-type regions;

wherein none of the P-type pillars in the active region is in contact with the N+ substrate, and a distance between the surface of the N+ substrate and a bottom of any one of the P-type pillars in the active region is greater than a thickness of the transition region.

15. The superjunction device according to claim 14, wherein none of the P-type annular columns in the terminal protection region is in contact with the N+ substrate, and a distance between the surface of the N+ substrate and a bottom of any one of the P-type annular columns in the terminal protection region is greater than the thickness of the transition region.

16. The superjunction device according to claim 14, wherein each P-type annular column in the terminal protection region forms a contact with the N+ substrate through a P-type implantation ring formed in the N-type epitaxial layer between the N+ substrate and a bottom of the P-type annular column.

17. The superjunction device according to claim 14, wherein at least one P-type annular column at the outermost of the terminal protection region is not in contact with the N+ substrate, a distance between the surface of the N+ substrate and a bottom of the at least one P-type annular column at the outermost being greater than the thickness of the transition region, each of the rest of the P-type annular columns in the terminal protection region forming a contact with the N+ substrate through a P-type implantation ring formed in the N-type epitaxial layer between the N+ substrate and a bottom of the P-type annular column.

18. The superjunction device according to claim 14, further comprising:
P-wells, formed beneath a surface of the N-type epitaxial layer in the active region, each P-well covering a top of a P-type pillar and surrounding the P-type pillar; and
a P-type ring, formed beneath the surface of the N-type epitaxial layer in the terminal protection region, being adjacent to the active region and covering at least one of the P-type annular columns.

19. The superjunction device according to claim 18, further comprising:
source regions, formed in each of the P-wells;
gate structures, formed above the N-type epitaxial layer, each gate structure corresponding to a P-well and comprising a gate oxide and a polysilicon gate formed thereon;
a drain electrode, formed at a backside of the N+ substrate;
a channel stopper, formed beneath the surface of the N-type epitaxial layer and being close to an outside border of the terminal protection region;
a terminal dielectric film, formed on the N-type epitaxial layer in the terminal protection region, having a step structure at a side near the active region, covering the P-type ring and all of the P-type annular columns in the terminal protection region;
a polysilicon field plate, formed on the terminal dielectric film and covering a part of the terminal dielectric film which contains the entire step structure; and
an inter layer film, formed on the N-type epitaxial layer in the terminal protection region, the terminal dielectric film, the polysilicon field plate, and top face and side faces of each gate structure.

20. A method for manufacturing the superjunction device according to claim 18, comprising:

step 1: forming a first N-type epitaxial layer on an N+ substrate, a thickness of the first N-type epitaxial layer being greater than or equal to that of a transition region in the first N-type epitaxial layer; forming a plurality of first P-type stripes in the active region and a plurality of first P-type implantation regions surrounding the active region in the terminal protection region by implanting a P-type impurity into the first N-type epitaxial layer, wherein none of the first P-type stripes or the first P-type implantation regions is in contact with the N+ substrate, and a distance between the surface of the N+ substrate and a bottom of any one of the first P-type stripes or the first P-type implantation regions is greater than a thickness of the transition region in the first N-type epitaxial layer;

step 2: forming a second N-type epitaxial layer on the first N-type epitaxial layer, and forming a plurality of second P-type stripes in the active region and a plurality of second P-type implantation regions surrounding the active region in the terminal protection region by implanting a P-type impurity into the second N-type epitaxial layer, wherein a number of the second P-type stripes is equal to that of the first P-type stripes, and each second P-type stripe is vertically aligned with and in contact with a first P-type stripe; a number of the second P-type implantation regions is equal to that of the first P-type implantation regions, and each second P-type implantation region is vertically aligned with and in contact with a first P-type implantation region;

step 3: repeating step 2 to form a third to an n-th N-type epitaxial layer on the second N-type epitaxial layer in sequence and forming P-type stripes and P-type implantation regions in the respective N-type epitaxial layers until a total thickness of the N-type epitaxial layer formed by the respective N-type epitaxial layers meets a process requirement, wherein the P-type stripes in the respective N-type epitaxial layers are connected from bottom up to form P-type pillars, and the P-type implantation regions in the respective N-type epitaxial layers are connected from bottom up to form P-type annular columns, so as to form alternately arranged P-type and N-type regions respectively in the active region and in the terminal protection region; and step 4: forming P-wells in the active region and a P-type ring in the terminal protection region beneath a surface of the n-th N-type epitaxial layer.

21. A method for manufacturing the superjunction device according to claim 18, comprising:

step 1: forming a first N-type epitaxial layer on an N+ substrate, a thickness of the first N-type epitaxial layer being greater than or equal to that of a transition region in the first N-type epitaxial layer; forming a plurality of P-type implantation rings surrounding the active region and contacting with the N+ substrate by implanting a P-type impurity into the first N-type epitaxial layer in the terminal protection region;

step 2: forming a second N-type epitaxial layer on the first N-type epitaxial layer; forming a plurality of first P-type stripes in the active region and a plurality of first P-type implantation regions surrounding the active region in the terminal protection region by implanting a P-type impurity into the second N-type epitaxial layer, wherein none of the first P-type stripes in the active region is in contact with the N+ substrate, and a distance between the surface of the N+ substrate and a bottom of any one of the first P-type stripes in the active region is greater than a thickness of the transition region in the first N-type epitaxial layer; a number of the first P-type implantation regions in the terminal protection region is greater than or equal to that of the P-type implantation rings, each P-type implantation ring having a first P-type implantation region formed there-above with a bottom of the first P-type implantation region contacting therewith; when the number of the first P-type implantation regions is greater than that of the P-type implantation rings, first P-type implantation regions not in contact with the P-type implantation rings are all situated at the outermost of the terminal protection region and are separated from the N+ substrate by a distance greater than the thickness of the transition region in the first N-type epitaxial layer;

step 3: forming a third N-type epitaxial layer on the second N-type epitaxial layer; forming a plurality of second P-type stripes in the active region and a plurality of second P-type implantation regions in the terminal protection region by implanting a P-type impurity into the third N-type epitaxial layer, wherein a number of the second P-type stripes is equal to that of the first P-type stripes, and each second P-type stripe is vertically aligned with and in contact with a first P-type stripe; a number of the second P-type implantation regions is equal to that of the first P-type implantation regions, and each second P-type implantation region is vertically aligned with and in contact with a first P-type implantation region;

step 4: repeating step 3 to form a fourth to an n-th N-type epitaxial layer on the third N-type epitaxial layer in sequence and forming P-type stripes and P-type implantation regions in the respective N-type epitaxial layers until a total thickness of the N-type epitaxial layer formed by the respective N-type epitaxial layers meets a process requirement, wherein the P-type stripes in the respective N-type epitaxial layers are connected from bottom up to form P-type pillars and the P-type implantation regions in the respective N-type epitaxial layers are connected from bottom up to form P-type annular columns, so as to form alternately arranged P-type and N-type regions respectively in the active region and in the terminal protection region; and step 5: forming P-wells in the active region and a P-type ring in the terminal protection region beneath a surface of the n-th N-type epitaxial layer.

* * * * *